(12) United States Patent
Dickson et al.

(10) Patent No.: US 7,774,396 B2
(45) Date of Patent: Aug. 10, 2010

(54) METHOD AND DEVICE FOR LOW DELAY PROCESSING

(75) Inventors: Bonar Dickson, Richmond (AU);
Brenton Robert Steele, Blackburn South (AU)

(73) Assignee: Dynamic Hearing Pty Ltd, Victoria (AU)

( * ) Notice: Subject to any disclaimer, the term of this patent is extended or adjusted under 35 U.S.C. 154(b) by 1300 days.

(21) Appl. No.: 11/283,540

(22) Filed: Nov. 18, 2005

(65) Prior Publication Data

US 2007/0118367 A1    May 24, 2007

(51) Int. Cl.
*G06F 17/10* (2006.01)
(52) U.S. Cl. ...................................... 708/322
(58) Field of Classification Search ................ 708/322, 708/323
See application file for complete search history.

(56) References Cited

U.S. PATENT DOCUMENTS

| | | | |
|---|---|---|---|
| 5,680,393 | A | 10/1997 | Bourmeyster et al. |
| 6,731,767 | B1 | 5/2004 | Blamey et al. |
| 2003/0072464 | A1 | 4/2003 | Kates |
| 2003/0081804 | A1* | 5/2003 | Kates ......................... 381/316 |
| 2003/0187637 | A1 | 10/2003 | Kang et al. |
| 2004/0019481 | A1* | 1/2004 | Saito ......................... 704/224 |
| 2004/0175011 | A1 | 9/2004 | Schaub |

FOREIGN PATENT DOCUMENTS

| | | |
|---|---|---|
| EP | 1 271 472 A2 | 1/2003 |
| EP | 1538749 | 6/2005 |
| WO | WO 91/16769 | 10/1991 |
| WO | WO 96/08879 | 3/1996 |
| WO | WO 03/015464 A2 | 2/2003 |
| WO | WO 03/015468 A1 | 2/2003 |

OTHER PUBLICATIONS

Yun, et al., *Subband Active Noise Control Algorithm Based on a Delayless Subband Adaptive Filter Architecture*, IEEE International Conference on Acoustics, Speech and Signal Processing, vol. 1, (1997), pp. 391-394.
International Search Report dated Mar. 7, 2007, for PCT/AU2006/001778, in the name of Dynamic Hearing Pty Ltd et al.

(Continued)

*Primary Examiner*—Chuong D Ngo
(74) *Attorney, Agent, or Firm*—Christie, Parker & Hale LLP.

(57) ABSTRACT

Adaptive processing of an input signal is achieved by offline analysis, with inline processing comprising an adaptive filter. The method comprises passing the input signal through an adaptive time domain filter to produce an output signal. The input signal and/or output signal is used as an offline analysis signal. The analysis signal is transformed into a transform domain (eg frequency domain) to produce a transformed analysis signal. The transformed analysis signal is analysed, for example by ADRO, to produce a plurality of desired gains each corresponding to a respective transform domain subband. A time domain filter characteristic is synthesised to at least approach the desired gains. The adaptive filter is updated with the synthesised filter characteristic. Minimum phase adaptive filter techniques are found to possess particular benefits in this scheme.

21 Claims, 32 Drawing Sheets

OTHER PUBLICATIONS

R. Merched et al., *A Delayess Subband Adaptive Filter Structure*, IEEE Transactions on Signal Processing vol. 47,No. 6, pp. 1580-1591, Jun. 1999.

E. J. Diethorn, *A Low-Comlexity, Background-Noise Reduction Preprocessor For Speech Encoders*, Speech Coding for Telecommunications Proceeding, 1997, pp. 45-46.

Oppenheim, A.V., et al., *Discrete-Time Signal Processing*, Englewood Cliffs, NJ:Prentice-Hall Inc., 1989.

Agnew, J. et al., *Just Noticeable and Objectionable Group Delays in Digital Hearing Aids*, Journal of the American Academy of Audiology, No. 11, 2000, pp. 330-336.

Groth, J. et al, *Disturbance caused by varying propagation delay in non-occluding hearing aid fittings*, International Journal of Audiology, No. 43, 2004, pp. 594-599.

Stone, M.A. et al., *Tolerable Hearing-Aid Delays:IV. Effects on Subjective Disturbance During Speech Production by Hearing-Impaired Subjects*, Ear & Hearing, No. 26, 2005, pp. 225-2325.

*IEEE Std 269-2002: Standard Methods for Measuring Transmission Performance of Analog and Digital Telephone Sets, Handsets, and Headsets*, The Institute of Electrical and Electronics Engineers (IEEE), New York, NY, 2002.

*ITU-T Recommendation P. 340: Transmission characteristics and speech quality parameters for hands-free terminals*, International Telecommunication Union (ITU), May 2000.

*Telstra Specification TP TT404.B51: Specification—Headset & Limiting Amplifier. Acoustic Protection*, Telstra Corporation Limited, Issue 3.1, Jun. 11, 2001 (On Order).

Morgan, D.R. et al., *A Delayless Subband Adaptive Filter Architecture*, IEEE Transactions on Signal Processing, vol. 43(8), Aug. 1995, pp. 1819-1830.

Dam, H.H. et al., *Non-Causal Delayless Subband Adaptive Equalizer*, Proceedings of the IEEE International Conference on Acoustics, Speech, and Signal Processing, vol. 3, 2002, pp. 2649-2652.

Wang, R. et al., *Suppression of Acoustic Oscillations in Hearing Aids Using Minimum Phase Techniques*, Proceedings of the IEEE International Symposium on Circuits and Systems, 1993, pp. 818-821.

Kemerait, R.C. et al., *Signal Detection And Extraction By Cepstrum Techniques*, IEEE Transactions on Information Theory, vol. 18(6), Nov. 1972, pp. 745-759.

J. Makhoul, *Spectral Analysis Of Speech By Linear Prediction*, IEEE Transactions on Audio and Electroacoustics, vol. 21(3), Jun. 1973, pp. 140-148.

Lee, C. et al, *Optimizing Feature Extraction For Speech Recognition*, IEEE Transactions on Speech and Audio Processing, vol. 11(1), Jan. 2003, pp. 80-87.

Damera-Venkata, N. et al., *Design of Optimal Minimum-Phase Digital FIR Filters Using Discrete Hilbert Transforms*, IEEE Transactions on Signal Processing, vol. 48(5), May 2000, pp. 1491-1495.

Dam, H.H. et al., *Design of Minimum-Phase Digital Filters as the Sum of Two Allpass Functions Using the Cepstrum Technique*, IEEE Transactions on Signal Processing, vol. 51(3), Mar. 2003, pp. 726-731.

Vainio, O., *Minimum-Phase Fir Filters For Delay-Constrained Noise Reduction*, IEEE Transactions on Instrumentation and Measurement, No. 6, Dec. 1999, pp. 1100-1102.

\* cited by examiner

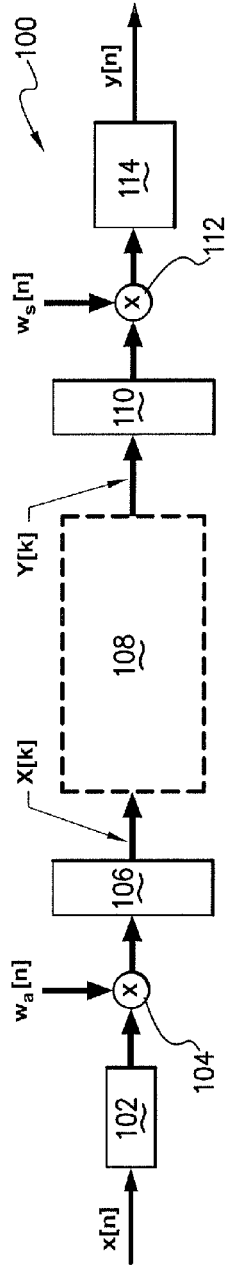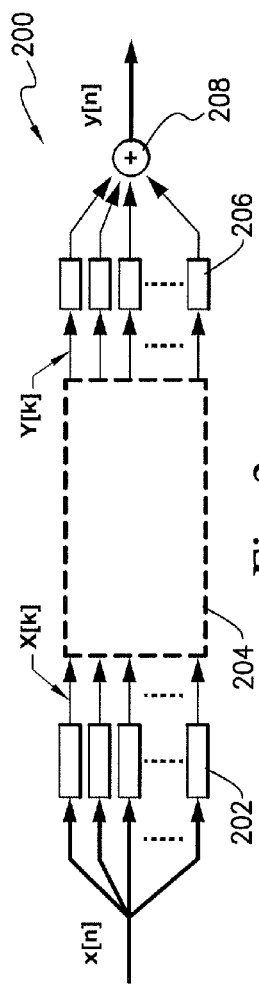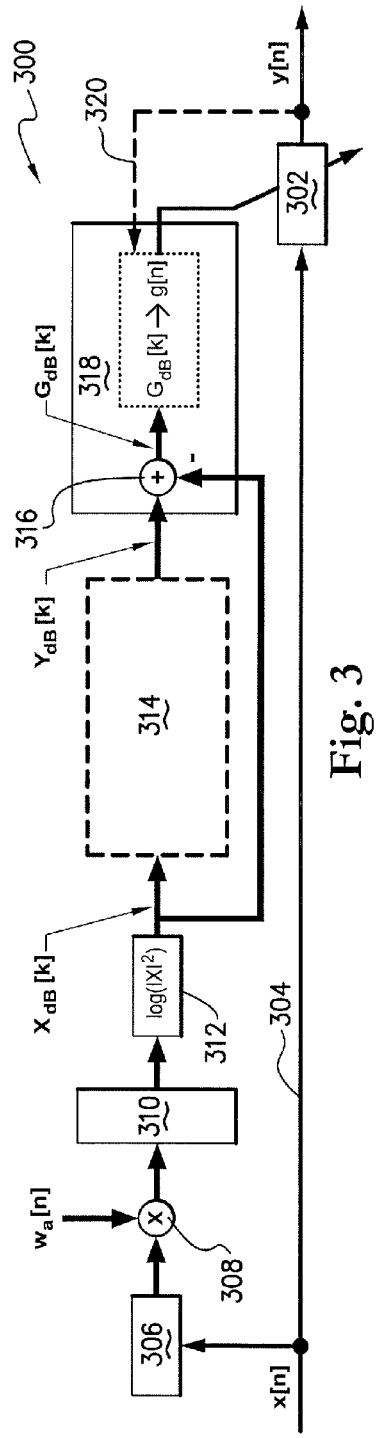
Fig. 1
Fig. 2
Fig. 3

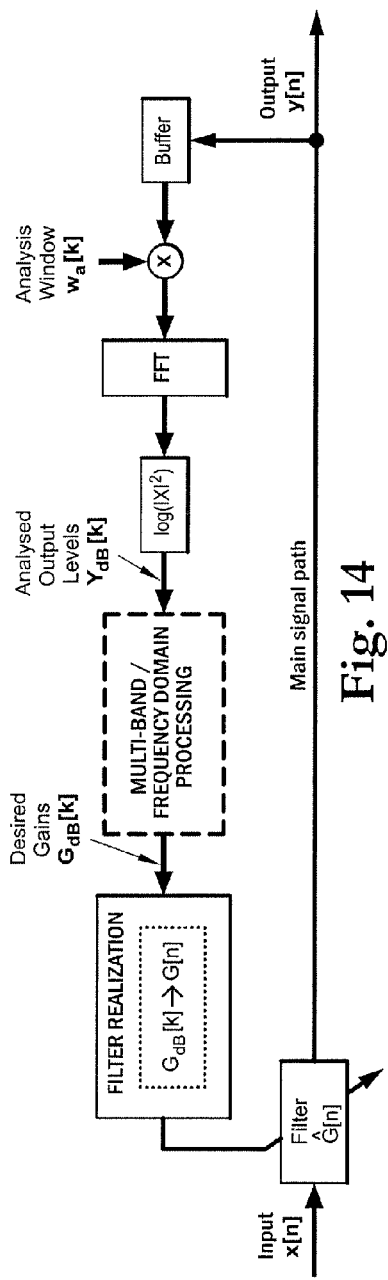
Fig. 14
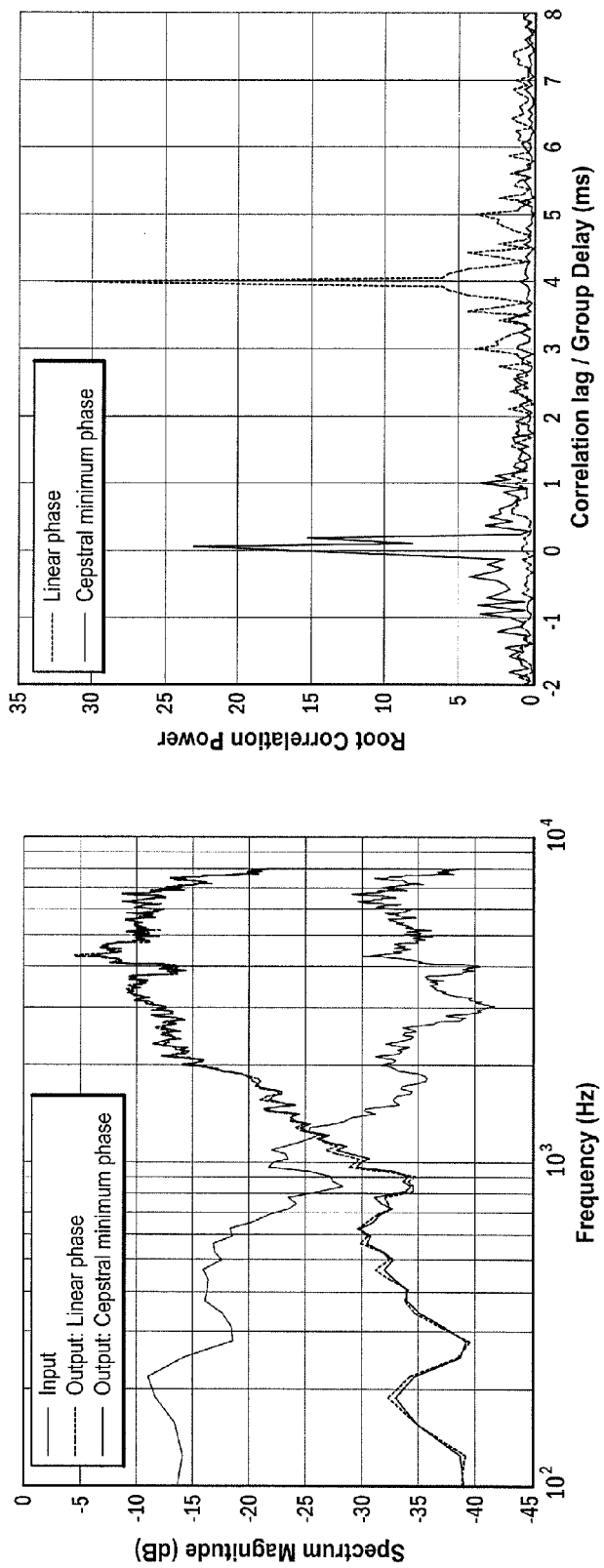
Fig. 15a
Fig. 15b

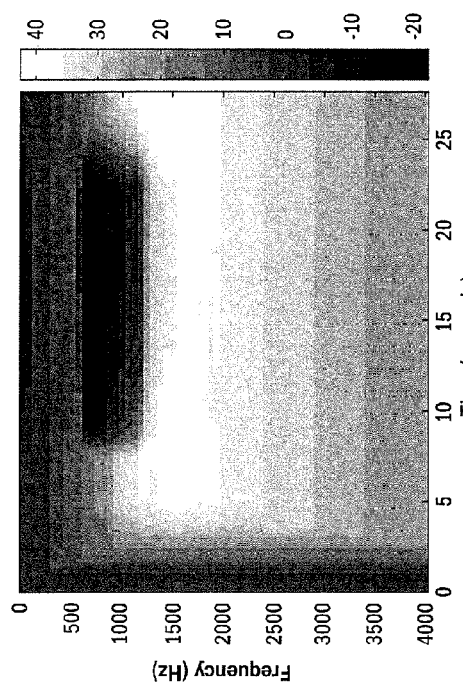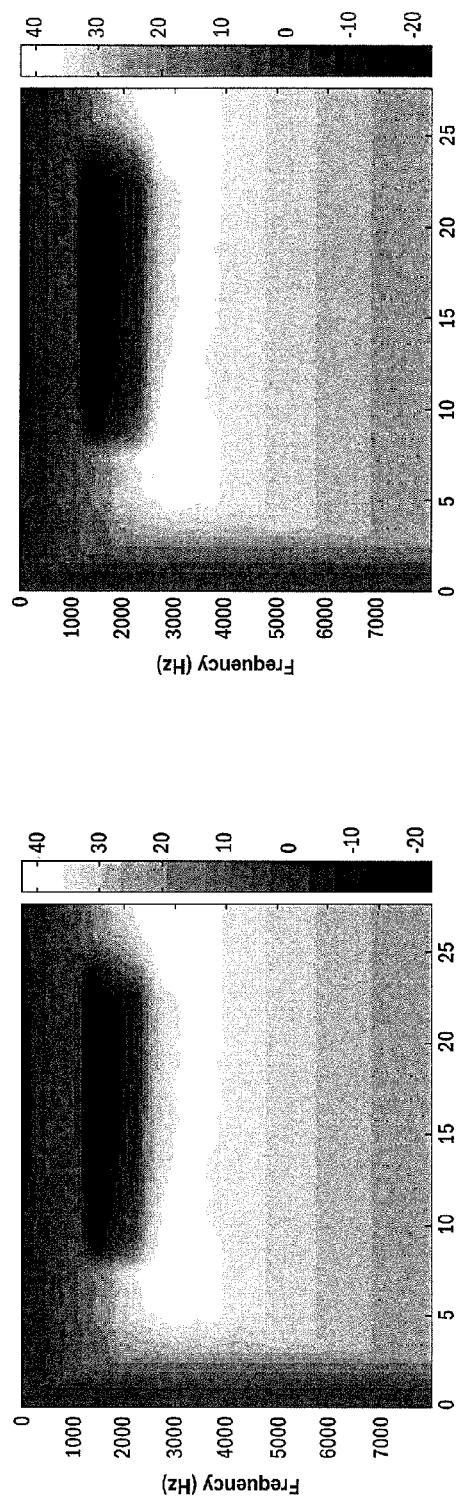
Fig. 24a
Fig. 24b
Fig. 24c

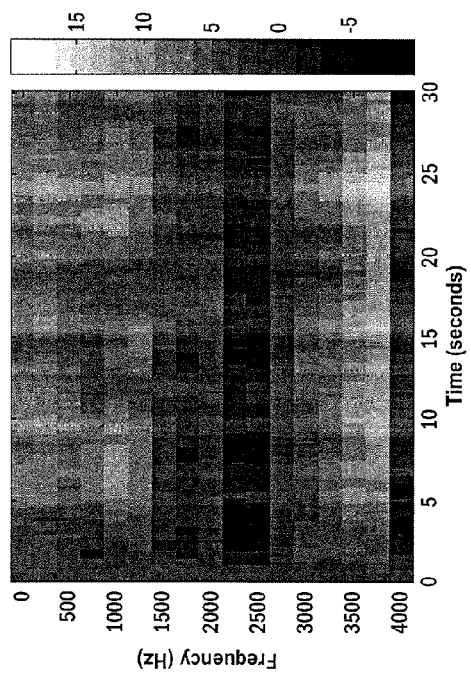
Fig. 25a
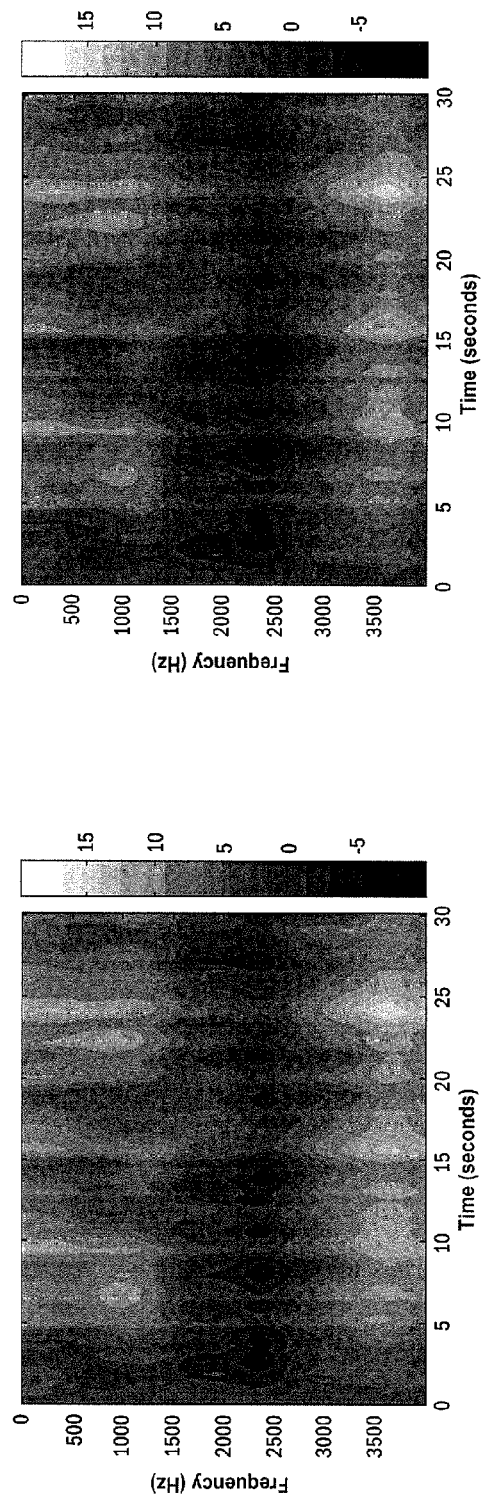
Fig. 25c
Fig. 25b

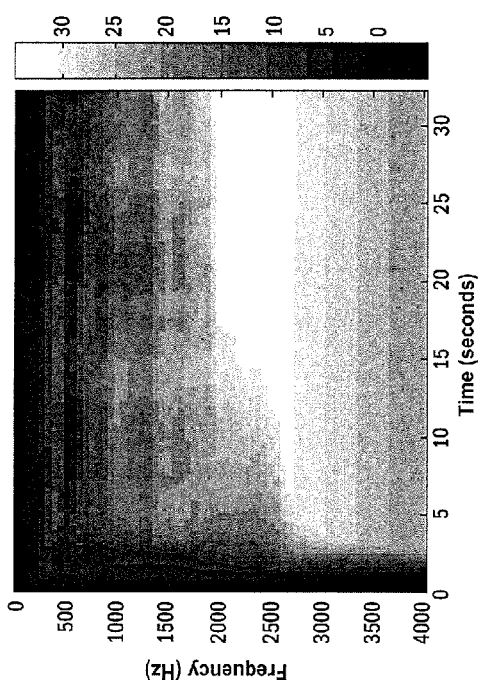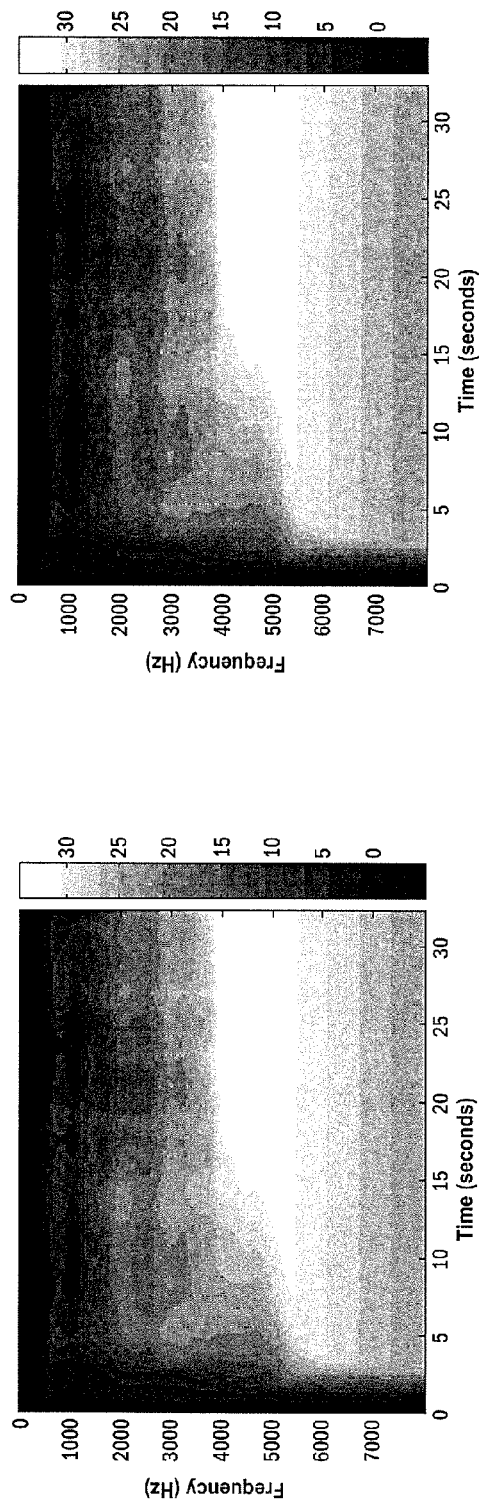
Fig. 26a
Fig. 26b
Fig. 26c

US 7,774,396 B2

METHOD AND DEVICE FOR LOW DELAY PROCESSING

FIELD OF THE INVENTION

The present invention relates to signal processing, and in particular relates to adaptively processing a signal in a manner which introduces minimal delay.

BACKGROUND OF THE INVENTION

A design problem in many signal processing applications is to perform a given task or algorithm on a signal while introducing as little delay as possible. This delay is usually characterize by a measure known as group delay, defined as the negative rate of change of the total introduced phase shift with respect to angular frequency, $-d\theta/d\omega$. A filter or system that introduces a constant group delay with respect to frequency is said to have linear phase. A filter or system with non-linear phase introduces variable delay with frequency (A. V. Oppenheim and R. W. Schafer, Discrete-Time *Signal Processing*, Englewood Cliffs, N.J.: Prentice-Hall Inc., 1989).

The importance of group delay depends on application, but is particularly critical in the design of audio devices, such as telephones, mobile phones, headsets, hearing aids, and cochlear implants. Introduction of additional signal path delay in these devices can have a significant impact on performance and usability. Specific problems can include:

increased perceivable echo from network or acoustic sources;

reduced perceptual coherence between user's own voice and side-tone or assisted listening path;

reduced perceptual coherence between listening cues & other sensory (eg visual) cues;

reduced control and integrity of delay differences in binaural listening;

reduced opportunity to avoid other perceptual problems, such as the occlusion effect (as described in J. Agnew and J. M. Thornton, *Just Noticeable and Objectionable Group Delays in Digital Hearing Aids*, Journal of the American Academy of Audiology, no. 11, pp. 330-336, 2000, J. Groth and M. B. Søndergaard, *Disturbance caused by varying propagation delay in non-occluding hearing aid fittings*, International Journal of Audiology, no. 43, pp. 594-599, 2004, M. A. Stone and B. C. J. Moore, *Tolerable Hearing-Aid Delays: IV. Effects on Subjective Disturbance During Speech Production by Hearing-Impaired Subjects*, Ear & Hearing, no. 26, pp. 225-235, 2005);

increased likelihood of feedback or gain stability;

increased resource requirements for echo or feedback cancellation; and reduced sound quality, intelligibility and clarity of communication.

Telecommunication standards also mandate strict compliance to rigorous specifications on group delay and its related effects, in order to maintain quality of communication in the network (for example see *IEEE Std 269-2002: Standard Methods for Measuring Transmission Performance of Analog and Digital Telephone Sets, Handsets, and Headsets*, The Institute of Electrical and Electronics Engineers (IEEE), New York N.Y., 2002, *ITU-T Recommendation P. 340: Transmission characteristics and speech quality parameters for hands-free terminals*, International Telecommunication Union (ITU), May 2000, *Telstra Specification TP TT404B51: Specification—Headset & Limiting Amplifier. Acoustic Protection*. Telstra Corporation Limited, Issue 3.1, 11 June 2001).

Many modern audio devices use multi-band, or transform domain, signal processing techniques to improve some aspect of performance, but often incur significant group delay in the process. A predominant class of multi-band techniques utilized in audio processing applications uses block processing, with a Fast Fourier Transform (FFT) analysis, and Inverse Fast Fourier Transform (IFFT) overlap-add synthesis, to analyse and process signals in frequency sub-bands. This type of technique is depicted in the generalized block diagram of FIG. 1. In FIG. 1 the processing path 100 takes an input signal x[n] which is buffered by buffer 102 and then windowed with an analysis window $w_a[n]$ at 104. FFT block 106 then produces a frequency domain input X[k], which is suitably processed by a multi-band/frequency domain processing block 108 to generate a frequency domain output Y[k]. The frequency domain output Y[k] is passed through IFFT block 110, windowed at 112 with a synthesis window $w_s[n]$, and passed through overlap-add and de-buffer block 114 to produce output y[n].

A significant proportion of the group delay incurred in the arrangement of FIG. 1 occurs because of the necessity to initially buffer the input signal at 102 to be suitable for subsequent block operations in the signal path such as windowing 104, FFT 106, and IFFT 110. At a minimum, the group delay $t_1(min)$ is equivalent to the sample period multiplied by the window block size or FFT length L, plus a constant, so that:

$$t_1(min) = L_{FFT}/f_s + t_p$$

where $f_s$ is the base sample rate in Hz, and $t_p$ is the additional latency required for the processor to perform the required operations to obtain the final output block y[n].

Several other multi-band processing structures have also been used in audio devices, some targeted specifically at reducing group delay. One such method applies a time domain filter bank using IIR or FIR filters in place of the FFT filter-bank structure applied in FIG. 1. This type of scheme is depicted in FIG. 2. The processing path 200 of FIG. 2 divides input x[n] into multiple paths, each of which is passed to a respective filterbank and downsample/decimation block 202 to produce multiple sub-band domain inputs X[k]. The sub-band domain inputs X[k] are subject to multi-band/frequency domain processing at 204 to produce sub-band domain outputs Y[k]. Following upsampling/interpolation at 206, the multiple paths are combined at 208 to produce an output y[n].

The reduced group delay in the scheme of FIG. 2 typically comes from avoiding the block processing and buffering requirements seen in the FFT filter-bank schemes. In theory the group delay of FIG. 2 can be very low, particularly if interpolation & decimation stages are not required, and minimum phase (minimum group delay) filters are used in the filter-bank 202. Minimum group delay $t_2(min)$ of FIG. 2 is:

$$t_2(min) = t_{tdf} + t_p$$

where $t_{tdf}$ is the minimum delay in the time domain filter-bank 202, and $t_p$ is again the additional latency required to process for realization of the final output y[n]. The scheme also has the advantage of flexibility in allowing more selective or non-uniform resolution filters in the filter-bank, for example to mimic the Bark scale, or to reflect critical bands in human hearing.

However the filter-bank design of FIG. 2 is sensitive to cross-over and phase matching requirements, and implementation is computationally expensive to achieve the sub band resolution achieved using an FFT for example. Furthermore, additional decimation and interpolation filtering is needed if the core processing is to be performed at a lower sample rate appropriate to the sub-band bandwidth. This decimation and interpolation process incurs additional group delay, but is important for the computational efficiency of many algorithms that would be used for the core processing.

Any discussion of documents, acts, materials, devices, articles or the like which has been included in the present specification is solely for the purpose of providing a context for the present invention. It is not to be taken as an admission that any or all of these matters form part of the prior art base or were common general knowledge in the field relevant to the present invention as it existed before the priority date of each claim of this application.

Throughout this specification the word "comprise", or variations such as "comprises" or "comprising", will be understood to imply the inclusion of a stated element, integer or step, or group of elements, integers or steps, but not the exclusion of any other element, integer or step, or group of elements, integers or steps.

SUMMARY OF THE INVENTION

According to a first aspect, the present invention provides a method of adaptively processing an input signal, the method comprising:

passing the input signal through an adaptive time domain filter to produce an output signal;

taking at least one of the input signal and the output signal as an analysis signal;

transforming the analysis signal into a transform domain to produce a transformed analysis signal;

analysing the transformed analysis signal to produce a plurality of desired gains each corresponding to a respective transform domain sub-band;

synthesising a minimum phase time domain filter characteristic which approaches the desired gains; and updating the adaptive filter with the synthesised filter characteristic.

According to a second aspect, the present invention provides a computer program for adaptively processing an input signal, the computer program comprising:

code for passing the input signal through an adaptive tie domain filter to produce an output signal;

code for taking at least one of the input signal and the output signal as an analysis signal;

code for transforming the analysis signal into a transform domain to produce a transformed analysis signal;

code for analysing the transformed analysis signal to produce a plurality of desired gains each corresponding to a respective transform domain sub-band;

code for synthesising a minimum phase time domain filter characteristic which approaches the desired gains; and code for updating the adaptive filter with the synthesised filter characteristic.

According to a third aspect, the present invention provides a device for adaptively processing an input signal, the device comprising an adaptive time domain filter for producing an output signal from an input signal;

a transform block for taking an analysis signal from at least one of the input signal and the output signal, and for transforming the analysis signal into a transform domain to produce a transformed analysis signal;

a processor for analysing the transformed analysis signal to produce a plurality of desired gains each corresponding to a respective transform domain sub-band;

a filter synthesiser for synthesising a minimum phase time domain filter characteristic which approaches the desired gains, and for updating the adaptive filter with the synthesised filter characteristic.

By performing transform domain signal analysis in order to define the filter characteristic, the present invention provides for 'offline' signal analysis. That is, the transform domain analysis is not interposed between the input signal and the output signal, such that the output signal is not subject to a group delay caused by the offline analysis. Further, the present invention recognises that a filter characteristic, such as filter coefficients used to implement a filter, may be adaptively updated, and may be adaptively defined substantially in real time by such transform domain analysis.

Embodiments of the first to third aspects of the invention, utilising a minimum phase filter characteristic, will thus include filter characteristics of non-linear phase. An extent of the phase non-linearity is preferably limited to below a perception threshold. Such embodiments recognise that non-linear phase signal filtering can be substantially imperceptible to a user when phase non-linearity is maintained below such a threshold. Further, by synthesising a filter characteristic of minimum phase, such embodiments of the invention provide for particularly low group delay between the input signal and the output signal.

In embodiments of the invention where the transform domain is the frequency domain, synthesis of a minimum phase filter characteristic may comprise: obtaining the cepstrum (IFFT) of the logarithmically expressed desired gains; ensuring the cepstrum is causal; and taking the FFT of the causal cepstrum to produce logarithmically expressed minimum phase desired gains.

Such embodiments of the present invention recognise that the cepstrum is causal if and only if both the poles and zeros of the transfer function are inside the unit circle. Such embodiments of the present invention further recognise that a filter is minimum phase if both the poles and zeros of the transfer function are inside the unit circle. Thus, by ensuring that the cepstrum is causal, such embodiments provide for synthesis of a minimum phase filter. Such embodiments may thus combine log domain multi-band processing followed by immediate cepstrum calculation.

Ensuring the cepstrum is causal may comprise applying a folding sequence to the cepstrum, to 'fold' exponentials of the cepstrum (quefrency components) in the non-causal (rear) half of the cepstrum into the causal (forward) half of the cepstrum.

The folding sequence $\lambda_{min}[q]$ for ensuring the cepstrum is causal may comprise:

$$0 < \lambda_{min}[q] \leq 2 \text{ for } q=0 \ldots L/2+1$$

$$\lambda_{min}[q]=0 \text{ for } q=L/2+2 \ldots L-1,$$

where L is the window/FFT length, and $q=0 \ldots L-1$.

More preferably, the folding sequence is cepstrally smoothed to smooth the output minimum phase spectrum. By performing smoothing at the time of modifying the cepstrum, such embodiments may eliminate the need for use of synthesis time domain windowing. For example, the folding sequence may comprise:

$$\lambda_{min}[q]=0.54+0.46\cos(2\pi q/L) \text{ for } q=0 \text{ \& } L/2+1$$

$$\lambda_{min}[q]=1.08+0.92\cos(2\pi q/L) \text{ for } q=1 \ldots L/2$$

$$\lambda_{min}[q]=0 \text{ otherwise.}$$

In alternate embodiments, the folding sequence may comprise:

$\lambda_{min}[q]=1$ for $q=0$ & $L/2+1$ $\lambda_{min}[q]=2$ for $q=1 \ldots L/2$ $\lambda_{min}[q]=0$ otherwise.

In such embodiments, a synthesis window function is preferably applied in the time domain as part of filter synthesis, as such a folding sequence produces an asymmetric filter impulse response which typically peaks very early in the finite filter length.

Once made causal, the causal cepstrum may then be converted back to a complex numbered spectrum (logarithmically expressed minimum phase desired gains) by FFT. Such logarithmically expressed minimum phase desired gains may typically then be converted to linear expression by taking the exponential. Preferably, a computationally efficient technique of obtaining the exponential is applied. Linearly expressed minimum phase desired gains may then be returned to the time domain by IFFT to form the basis of time domain filter synthesis.

Such embodiments, when used to produce a FIR filter having an approximate minimum phase impulse response synthesised from such a smoothed causal cepstrum may provide for extremely low group delay for multi-band DSP algorithms, may provide improved independence of group delay relative to analysis or processing filter resolution, may provide for native provision for log domain sub-band processing, multi-band compression or expansion, anti-startle algorithms and the like, and/or may provide improved adaptive filtering accuracy compared to comparable linear phase methods. Such embodiments may provide reduced signal distortion and artifacts from avoidance of overlap-add re-construction and reduced finite precision arithmetic on signal, may provide improved control of design compromises in signal analysis vs. signal processing, may provide improved resistance to feedback from reduced delay and inherent phase variation, may provide the option to reduce computational load by reducing signal analysis and filter update rate, and may be particularly suitable for implementation in commonly used audio digital signal processors.

Where the adaptive filter is a FIR or IIR linear filter, alternate embodiments of the invention may synthesise the minimum phase filter characteristic by: expressing a characteristic polynomial of the filter, factoring the characteristic polynomial to locate poles and zeros of the filter; and revising the characteristic polynomial by reciprocating each pole and zero outside the unit circle into the unit circle, to obtain a minimum phase filter. Due to the potentially large or intractable computational complexity of factoring a characteristic polynomial, such embodiments may be best suited to applications where the adaptation rate of the filter is not required to be high, to provide sufficient time for such computations.

In embodiments of the invention, the adaptive filter may be a single FIR filter, a mix of filters, whether FIR or IIR, or may be non-linear such as a neural network. Synthesising the filter characteristic in a manner which approaches the desired gains may comprise ensuring that an adaptation rate of the adaptive filter remains no more than a pre-defined amount, for example in order to avoid inappropriate user perceptions which might be caused by large or overly rapid filter adaptations. In such embodiments the synthesised filter characteristic might thus approach, but not substantially match, the desired gains. Alternatively, synthesis of the time domain filter characteristic may comprise substantially matching the filter characteristic to the desired gains, to the extent possible when using a real time domain filter, for example in circumstances where filter adaptation rate is not required to be limited.

Embodiments of the invention may apply preventative measures to reduce the rate of gain variation between the desired gains, such that the synthesised filter is more likely to be able to replicate the desired response. For example, a difference between desired gains in adjacent transform domain sub-bands may be maintained within a pre-defined limit.

Further embodiments of the invention may apply compensatory measures to measure the extent of gain errors, and to apply appropriate feedback for ongoing iterations of generating desired gains and synthesising the filter so as to reduce such errors.

According to a fourth aspect, the present invention provides a method of adaptively processing an input signal, the method comprising:

passing the input signal through an adaptive time domain filter to produce an output signal;

talking at least one of the input signal and the output signal as an analysis signal;

transforming the analysis signal into a transform domain to produce a transformed analysis signal;

analysing the transformed analysis signal to produce a plurality of desired gains each corresponding to a respective transform domain sub-band;

synthesising a time domain filter characteristic which approaches pie desired gains; and updating the adaptive filter with the synthesised filter characteristic.

According to a fifth aspect, the present invention provides a computer program for adaptively processing an input signal, the computer program comprising:

code for passing the input signal through an adaptive time domain filter to produce an output signal;

code for taking at least one of the input signal and the output signal as an analysis signal;

code for transforming the analysis signal into a transform domain to produce a transformed analysis signal;

code for analysing the transformed analysis signal to produce a plurality of desired gains each corresponding to a respective transform domain sub-band;

code for synthesising a time domain filter characteristic which approaches the desired gains; and code for updating the adaptive filter with the synthesised filter characteristic.

According to a sixth aspect, the present invention provides a device for adaptively processing an input signal, the device comprising:

an adaptive time domain filter for producing an output signal from an input signal;

a transform block for taking an analysis signal from at least one of the input signal and the output signal, and for transforming the analysis signal into a transform domain to produce a transformed analysis signal;

a processor for analysing the transformed analysis signal to produce a plurality of desired gains each corresponding to a respective transform domain sub-band;

a filter synthesiser for synthesising a time domain filter characteristic which approaches the desired gains, and for updating the adaptive filter with the synthesised filter characteristic.

In embodiments of the fourth to sixth aspects of the invention the adaptive time domain filter may comprise a FIR filter, and the transform may comprise a FFT. In such embodiments, synthesis of the filter characteristic may comprise: applying a linear phase to the plurality of desired gains; returning the linear desired gains to the nine domain by IFFT; and applying a synthesis window to truncate the output of the IFFT to produce a finite linear phase impulse response. The synthesis window may comprise a rectangular window, a Hamming window, a hybrid asymmetric Hamming function, or other suitable window function. In alternate such embodiments of the invention, synthesis of the filter characteristic may comprise: returning the linear desired gains to the tie domain by IFFT; swapping and/or reordering the IFFT output to remove aliased non-causal components to derive a symmetric response; and applying a synthesis window to truncate the symmetric response to produce a finite linear phase impulse response.

Embodiments of the present invention may be applied in conjunction with the Adaptive Dynamic Range Optimization (ADRO) technique set out in U.S. Pat. No. 6,731,767. However, embodiments of the present invention may be applied in conjunction with any sound processing technique which involves changing the desired gain of the signal path.

It is to be appreciated that the phrase "sound signal" is used herein to refer to any signal conveying or storing sound information, and includes an electrical, optical, electromagnetic or digitally encoded signal.

BRIEF DESCRIPTION OF THE DRAWINGS

Examples of the invention will now be described with reference to the accompanying drawings in which:

FIG. 1 is a block diagram illustrating a known FFT overlap-add multi-band signal processing circuit;

FIG. 2 is a block diagram illustrating a known time domain filter bank for multi band signal processing;

FIG. 3 is a block diagram of a circuit for adaptive filtering signal processing with feed forward offline multi band analysis, in accordance with an embodiment of the present invention;

FIG. 14 is a block diagram of a closed loop feedback structure for adaptive signal processing in accordance with a sixth embodiment of the present invention;

FIGS. 15a and 15b illustrate the simulated power spectral density, and simulated cross correlation, respectively, of the third and fourth embodiments of the invention in response to an input signal;

FIGS. 24a to 24m illustrate the performance of the third and fifth embodiments of the invention under a hearing aid fitting of ADRO for the audiogram of FIG. 22, in response to a speech+alarm input signal;

FIGS. 25a to 25m illustrate the performance of the third and fifth embodiments of the invention under a telephony fitting of ADRO for normal hearing, in response to a speech input signal; and FIGS. 26a to 26m illustrate the performance of the third and fifth embodiments of the invention under a hearing aid fitting of ADRO for the audiogram of FIG. 22, in response to a speech input signal.

DETAILED DESCRIPTION OF THE PREFERRED EMBODIMENTS

Figure 4A:
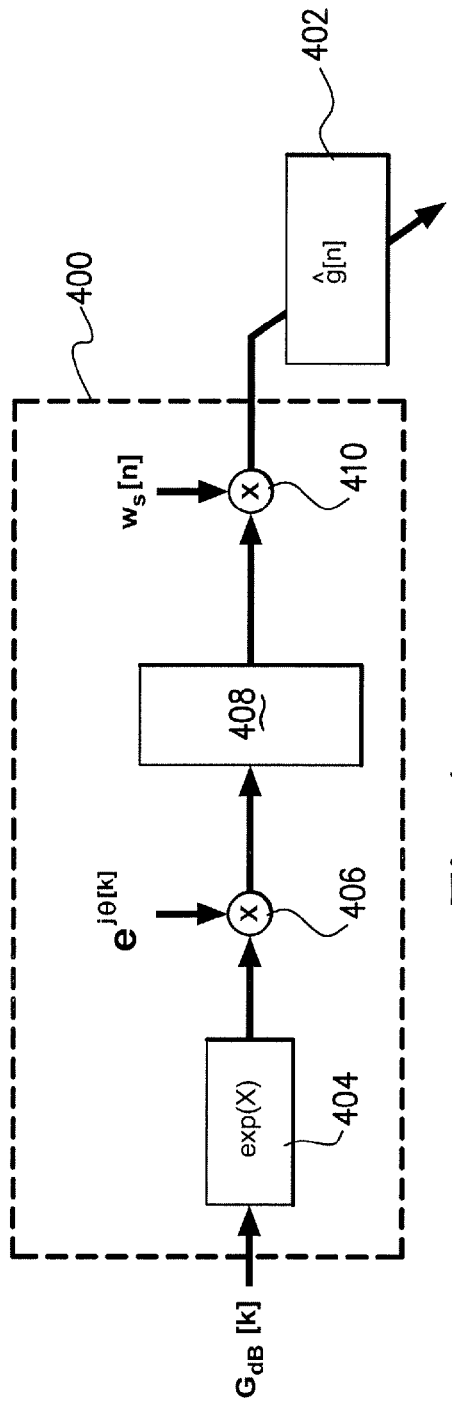
FIGS. 4a and 4b illustrate two similar filter realisations utilising real time windowing in accordance with a second and third embodiment of the invention.

FIG. 3 is a block diagram of a circuit 300 for adaptive filtering signal processing with feed forward offline multi band analysis, in accordance with an embodiment of the present invention. An adaptive time domain filter $\hat{g}[n]$ 302 processes an input signal x[n] to produce an output signal y[n]. As can be seen, the signal through path 304 is not impeded by anything other than filter 302.

Input signal x[n] is also used as an analysis signal by being passed to buffer 306. The output of buffer 306 is windowed at 308 by an analysis window $w_a[n]$ and then passed through a FFT block 310. The FFT output is converted to the logarithmic power domain by block 312 to produce analysed input levels $X_{dB}[k]$. Block 314 undertakes multi-band frequency domain processing of the analysed input levels $X_{dB}[k]$ in accordance with the ADRO technique to produce desired output levels $Y_{dB}[k]$, from which the analysed input levels $X_{dB}[k]$ are subtracted at 316 to produce desired gains $G_{dB}[k]$. Filter realisation block 318 takes the desired gains in order to synthesise a time domain filter characteristic, and updates the adaptive filter 302 to at least approach the synthesised filter characteristic. A feedback path 320 may also be utilised by block 318 in filter synthesis.

The first embodiment of the invention set out in FIG. 3 recognises that the delay in the block based FFT mechanism 306, 310, 314, etc, is a requirement for the analysis of the signal x[n] only. Thus, the structure 300 of FIG. 3 provides for multi-band processing with reduced group delay using a computationally efficient FFT scheme by 'de-coupling' the signal analysis path from the processing path 304. This is achieved by using an offline analysis scheme that uses block processing for the analysis path, but adapts one or more time domain filters 302 to perform the processing of the signal x[n] at a single sample rate or reduced block size rate.

The circuit 300 of FIG. 3 performs multi-band analysis and processing based on log power domain (eg dB level) FFT analyses of the input signal, by provision of block 312. This is particularly convenient for many audio conditioning algorithms such as dynamic range compression or ADRO. Nevertheless alternate embodiments may omit block 312 and forgo log power domain analysis. Similarly, the front section FFT filter-bank analysis structure of the analysis path (306, 308, 310) prior to the core algorithm processing (312, 314), may in alternate embodiments be replaced with other analysis filter-bank mechanisms or other transfer blocks.

The task of the filter realisation block 318 is to take a specification of desired gains $G_{dB}[k]$ in each frequency subband, or transform domain sub-band, and to synthesize an appropriate time domain filter ĝ[n] having a filter magnitude response which suitably realizes the gain profile, when applied to the main signal path 304. Because the filter ĝ[n] 302 is not bound by the block processing constraints of the analysis path, it can be operated at a reduced block size or single sample rate. Substantial buffering can be avoided in the signal path 304, and the group delay in the signal path 304 therefore becomes that of the filter 302 alone.

In the embodiment of FIG. 3 the filter ĝ[n] is a single FIR filter. However in alternate embodiments the filter may be a mix of filters, either FIR or IIR, or may be nonlinear, such as a neural network. In terms of realizing a specific filter specification, it can be useful to combine filter types to exploit their respective advantages and account for their respective weaknesses.

Because a practical filter realisation process does not necessarily synthesize the ideal or optimal filter, the feedback path 320 can also be used to provide feedback regarding the state of signal y[n] after the filtering process. This provides for a more sophisticated gain control system that helps the offline structure 300 achieve the required filter specification as it changes with time.

Thus, the offline analysis circuit 300 provides for reduced group delay for the main signal path 304, and provides for de-coupling of signal analysis from signal processing, allowing independent and finer control of parameters for each aspect, such as the number of channels, channel bandwidth/spacing, and delay. The circuit 300 may further utilise a reduced analysis rate in the offline processing (e.g. in block 314) relative to the processing rate of the main signal path 304, which can lead to computational savings, bearing in mind the possible increased requirements for implementation of the filter ĝ[n] 302 in such an arrangement. Further, by undertaking fewer operations on the signal data along through path 304, circuit 300 may provide for reduced distortion and reduced introduction of signal processing artifacts such as quantization noise from limited precision operations, or periodic noise from a FFT a overlap-add synthesis reconstruction process.

The circuit 300 introduces a tie differential between signal analysis and signal processing. Thus signal changes that occur in less time than the time differential can propagate through the system before the system can respond. This might be compensated for by re-introducing some initial delay in the main signal path, preferably being minimal delay to avoid detracting from the low delay nature of the offline processing arrangement.

It is desirable to control the rate of variation of the filter ĝ[n] 302, for example in order to avoid introduction of perceptible artifacts caused by overly rapid variation of the filter taps or coefficients. In particular, the rate of gain variation should not be too large relative to the time span of the filter impulse response.

Figure 4B:
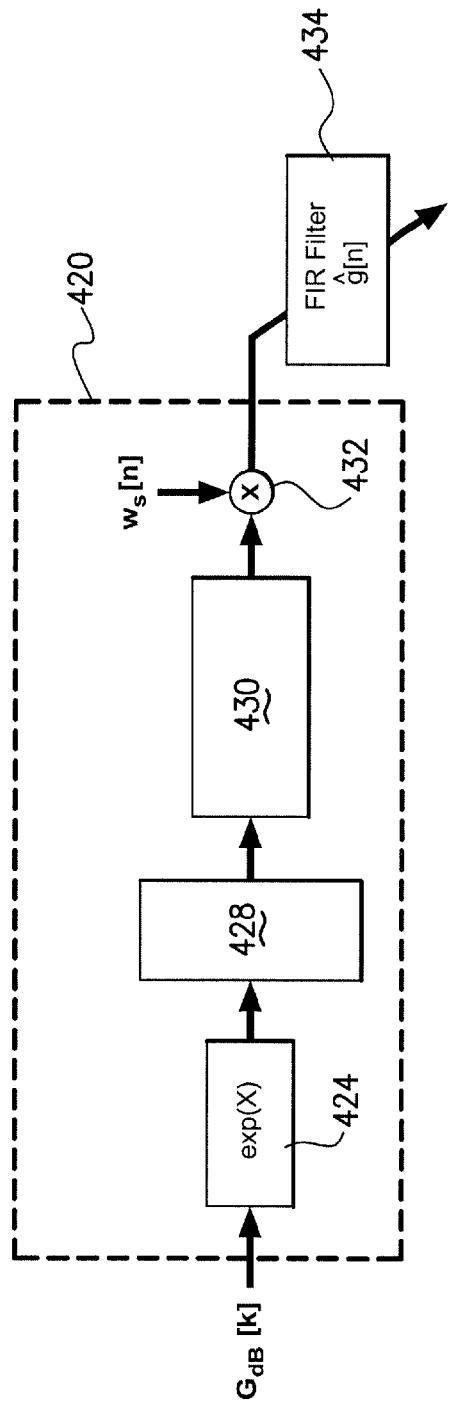

Implementation of the filter realisation block 318 may take a number of forms in accordance with different embodiments of the invention. FIGS. 4a and 4b illustrate two similar filter realisations utilising real time windowing in accordance with a second embodiment and a third embodiment of the invention. The embodiments of FIGS. 4a and 4b recognise that one means of filter realization to determine the coefficients of an FIR filter ĝ[n] from the log frequency domain gain specification $G_{dB}[k]$ is by real time realization of window design for a FIR filter. FIR filters are good candidate filters for use as filter 302 in FIG. 3, since they are all-zero and guaranteed to be stable, and therefore their design is relatively free of the problems or constraints that can apply to IIR filters. The real time FIR window design method of the second and third embodiments of the invention in FIGS. 4a and 4b uses a combination of an IFFT and synthesis window to find a truncated (i.e. finite) impulse response filter that is a smoothed approximation of the ideal filter expressed in the desired gains $G_{dB}[k]$. Two largely equivalent versions of the real time window design approach are depicted in the block diagrams of FIG. 4. The embodiments of FIGS. 4a and 4b differ in how a causal, linear phase, time symmetric impulse response is obtained.

In more detail, FIG. 4(a) shows a filter realisation block 400 which converts the logarithmic desired gains $G_{dB}[k]$ to linear by taking the exponential in block 404. At 406 an appropriate non-zero constant linear phase is injected in the frequency domain prior to the IFFT 408, in order to derive a causal, symmetric filter response directly after the IFFT 408. For example, for a filter/FFT length L, an appropriate phase function $e^{j\theta[k]}$ would typically be:

$$e^{j\theta[k]} = \cos(\theta[k]) + j\sin(\theta[k]) \text{ where } \theta[k] = -\pi k$$
$$= 1 \text{ for even } k, -1 \text{ for odd } k$$

where k=0 ... (L−1).

The output of IFFT 408 is windowed at 410 with an appropriate synthesis window $w_s[n]$, and the FIR filter ĝ[n] 402 is then updated with the filter characteristic so derived.

If appropriate linear phase is not injected, then the output of IFFT process 408 will be non-causal and 'time aliased', in that the filter response will wrap around in the window L such that non-causal components are rotated to the latter half of the window. FIG. 4b exploits this property and presents a similar architecture to FIG. 4a, but one that is often more computationally efficient. The filter realisation block 420 again converts the logarithmic desired gains $G_{dB}[k]$ to linear by taking the exponential in block 424. Zero phase is retained in the frequency domain by direct input to the IFFT 428, thereby avoiding the explicit injection of phase required in filter realisation 400 of FIG. 4a. Instead, the filter realisation 420 of FIG. 4b provides block 430 to re-order or swap halves of the output of the IFFT 428 to derive an equivalent symmetric response. The output of block 430 is windowed at 432 with an appropriate synthesis window $w_s[n]$ and the FIR filter $\hat{g}[n]$ 434 is then updated with the filter characteristic so derived.

The minimum group delay $t_{3+4}$(typ.) when using the filter realisation blocks 400 or 420 in the circuit 300 of FIG. 3, for a linear phase, symmetric FIR filter adapted using the window design method, is at worst half the minimum group delay for the FFT structure depicted in FIG. 1. In particular:

$$t_{3+4}(\text{typ.}) = L_g/(2*f_s) + t_p$$

where $L_g$ is the filter length, typically the same length as the FFT length $L_{FFT}$, and $t_p$ is the computational time required to process the filter. This computational time is typically significantly less than the equivalent computational time $t_p$ for FIG. 1.

The impulse response filter obtained using the window design filter realisations depicted in FIGS. 4a and 4b only provides an approximation of the ideal filter described by $G_{dB}[k]$. The exact impulse response equivalent of any practical frequency response $G_{dB}[k]$ would be infinite in length. The truncation implicit in the IFFT process provides a finite impulse response with a frequency response that is effectively the ideal frequency response $G_{dB}[k]$ convolved with the frequency response of the rectangular truncation window. The use of synthesis window $w_s[n]$ can compensate for the truncation process, by smoothing the spectral magnitude response, and providing control over certain parameters in the approximation. Trade-offs in the choice of synthesis window $w_s[n]$ are illustrated in FIG. 5, which compares Rectangular windows vs. Hamming windows, and some example results when used for filter synthesis.

Figure 5A:
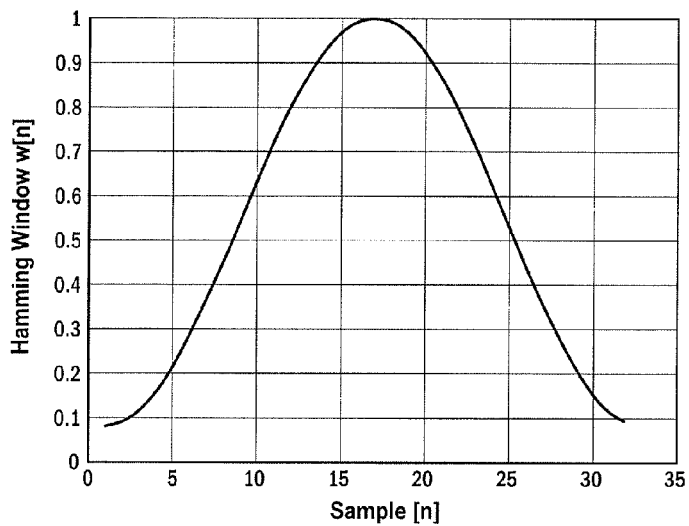
FIGS. 5a to 5c illustrate filter synthesis, respectively showing a Hamming window function, the magnitude response of the Rectangular and Hamming windows, and a sample plot of ideal vs. actual synthesised filter responses.
Figure 5B:
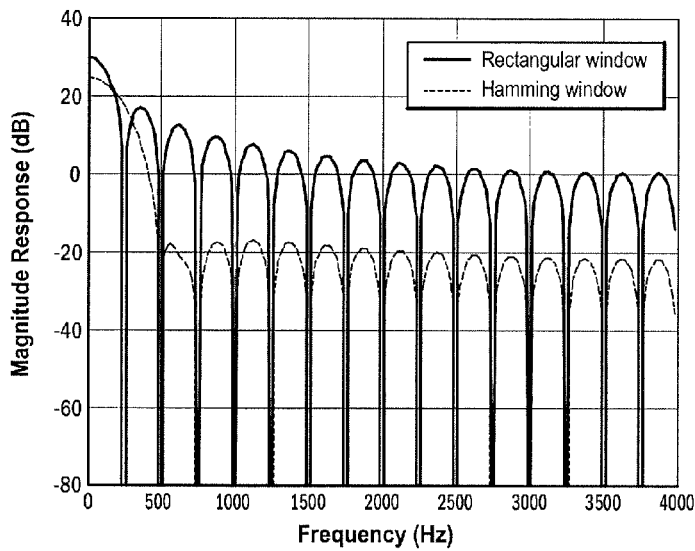
Figure 5C:
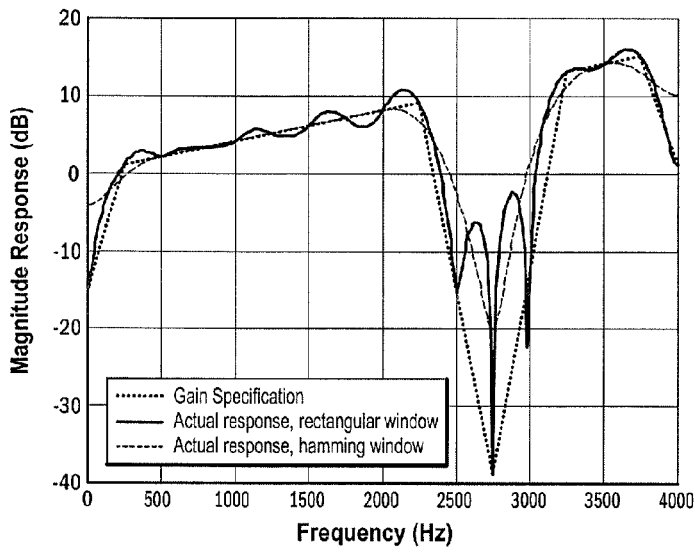

In more detail, FIG. 5a is a plot of the Hamming window function, FIG. 5b plots the magnitude responses of the Rectangular and Hamming windows, and FIG. 5c is a plot of an example ideal response, together with actual synthesized filter responses using either the rectangular window or the Hamming window.

FIG. 5c shows that the use of a rectangular window for $w_s[n]$ causes significant undesirable ripple in the synthesized filter magnitude response. The implementation using the Hamming window for $w_s[n]$ gives a much smoother response, which is particularly important for the pass-band regions of the magnitude response. However, both synthesized filter responses struggle to realize the full attenuation depth and width of the central notch in the example original gain specification. Additional measures can be used in the algorithmic structure of FIG. 3 to compensate for these types of filter approximation errors, as discussed in the following.

Other optimizations or variations may be made to the embodiments of FIG. 3, FIG. 4a and FIG. 4b, when using a symmetric linear phase filter. One class of optimization is to apply only a subsection of the synthesized filter impulse response, and/or to apply a truncated or asymmetric synthesis window $w_s[n]$. While such optimization may reduce the effective resolution of the filter $\hat{g}[n]$ to some extent, further reduction in group delay and computational load may be effected. The analysis also retains the full resolution provided by the original FFT length $L_{FFT}$.

Figure 6A:
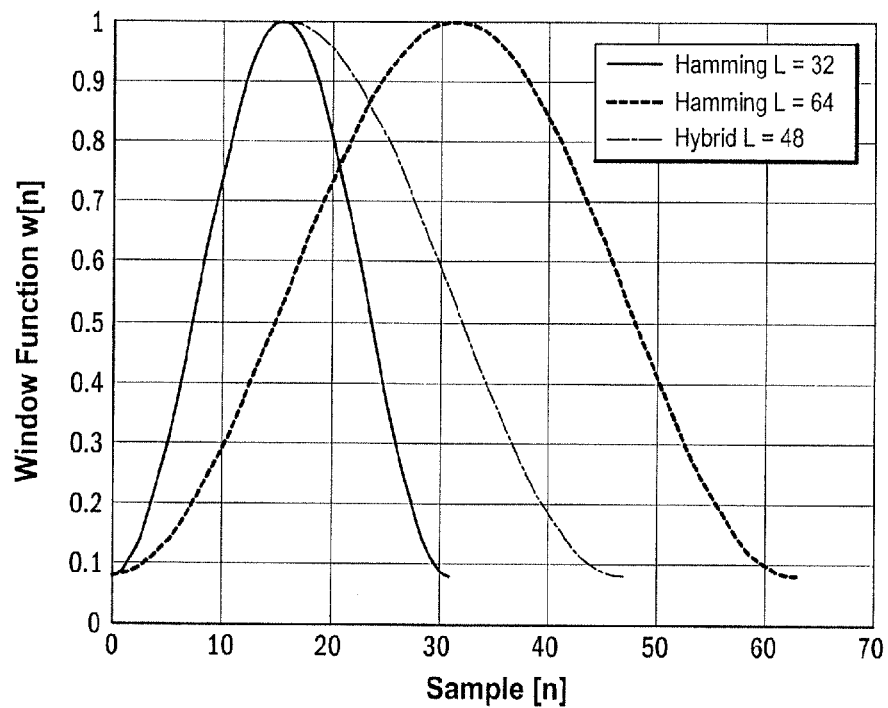
FIGS. 6a and 6b illustrate, respectively, three Hamming window functions, and the normalised magnitude responses of the three Hamming windows.
Figure 6B:
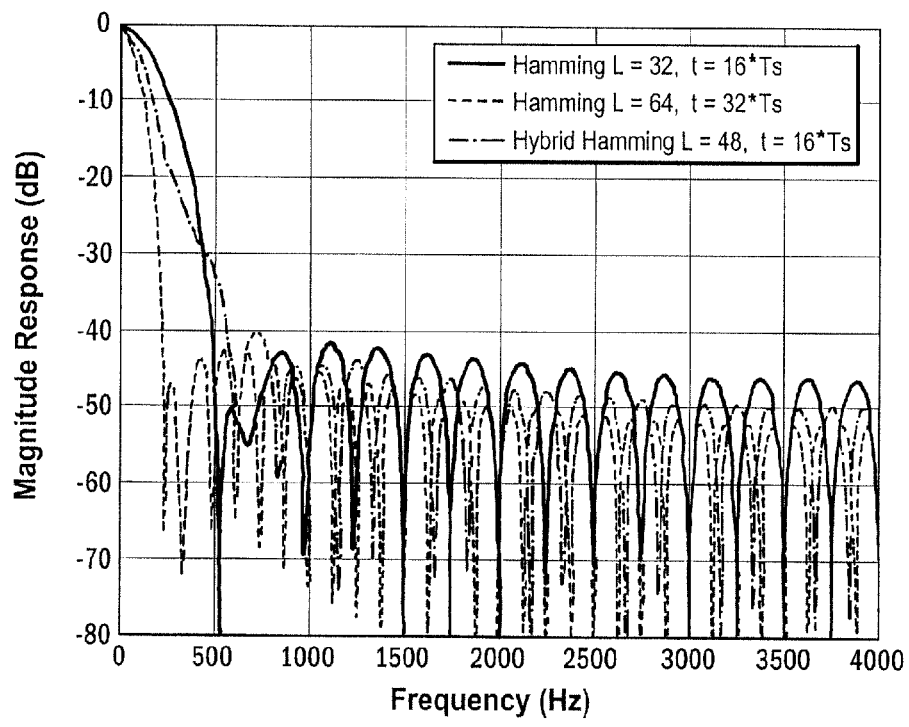

Use of an asymmetric or truncated window $w_s[n]$ is intended to reduce the lead in or rise time to peak of the final filter impulse response, thereby reducing group delay and shortening the filter. FIG. 6a shows example plots of length 32 and length 64 Hamming window functions, and a length 48 Hybrid-Asymmetric Hamming (HAH) window function composed of the first half of the length 32 Hamming window, appended with the last half of the length 64 Hamming window. FIG. 6b, illustrating the matching (normalised) magnitude functions, shows that the length 48 HAH window is a compromise between obtaining the group delay of a shorter length 32 symmetric window, while retaining improved main lobe width and side-lobe attenuation, these being key properties defining the effective filter resolution. This compromise is useful in the practical design of audio signal processing systems, and notably, is straightforward with the type of scheme depicted in FIGS. 3 & 4, whereas such a compromise is not clearly feasible in the scheme of FIG. 1.

The symmetric, linear phase FIR filters produced by the structures of FIGS. 4a and 4b when implemented in the structure of FIG. 3, provide for significantly reduced group delay when compared with the FFT overlap-add structure depicted in FIG. 1. However, embodiments of the present invention further recognise that strict phase linearity is not actually a requirement for many audio processing applications, for example because minor phase distortion has been found to be imperceptible in most cases. The present invention recognises that significant advantages may be offered by use of an in-line real time adaptive filter or filters having non-linear phase while retaining equivalent magnitude response.

The present invention further recognises that, of non-linear phase filters, minimum phase filters are well suited for low group delay magnitude response conditioning. By definition a minimum phase filter represents the unique, causal realization of a given magnitude response with minimum group delay for a given filter order. A minimum phase filter is defined as having both a causal and stable transfer function (poles inside the unit circle), and causal and stable inverse transfer function (zeroes inside the unit circle). Since FIR filters are entirely characterized by their zeroes, one way to obtain the minimum phase version of any FIR filter is to directly factor the characteristic polynomial, and reciprocate zeroes that lie outside the unit circle, into the unit circle. For example, for a given FIR filter transfer function H(z), with a zero at q that lies outside the unit circle, the transfer function can be factored as follows:

$$H(z) = H_A(z)(1 - qz^{-1})$$
$$= \underbrace{H_A(z)(1 - q^{-1}z^{-1})}_{H_B(z)} \underbrace{(1 - qz^{-1})/(1 - q^{-1}z^{-1})}_{\text{All pass } H_{ap}(z)}$$
$$= H_B(z) H_{ap}(z)$$

where $H_{ap}(z)$ is an all-pass filter, and $H_B(z)$ retains the magnitude response of H(z), but has altered phase, with the zero(s) reciprocated into the unit circle.

In practice, factoring an FIR filter polynomial can be a difficult or even intractable mathematical problem, particularly as the filter length increases. Therefore, obtaining the minimum phase filter for a time varying filter specification using the direct factoring technique in real time may not be practical in many real time applications. One option might be to obtain (in non-real time) a fixed 'quasi' minimum phase profile for an average or equilibrium of the filter magnitude responses expected, and to apply this phase to all frequency domain filter specifications, regardless of their magnitude response. However, the minimum phase characteristic of a given magnitude response is by definition unique, and the causality for the resultant filter is only guaranteed when the matching minimum phase for a given magnitude response is applied. Therefore, application of a fixed 'quasi' minimum phase is only likely to be practical when the magnitude response variation is expected to be small or is very heavily bounded, or when sufficient computational resources are available to perform factorisation within the timeframe required by the application.

An alternate method for deriving the minimum phase for a given magnitude response recognises and exploits a particular property of the real or complex cepstrum (the cepstrum being the inverse discrete Fourier transform of the log magnitude or log complex spectrum). The cepstrum property of interest is that the cepstrum is 'causal' if and only if both the poles and zeroes of the transfer function are inside the unit circle—i.e. the filter is minimum phase. Therefore, by subjecting the real cepstrum of the log magnitude spectrum to an appropriate 'folding sequence', the phase can be adjusted to be minimum without altering the spectral magnitude response. In accordance with such embodiments of the invention, the folding sequence effectively folds exponentials (termed 'quefrency' components) in the 'non-causal' (back) half of the cepstrum into the 'causal' (forward) half of the cepstrum. The adjusted cepstrum can then be converted back to a complex numbered spectrum via the discrete Fourier transform and complex exponential, and be used to design a time domain FIR filter.

Figure 7A:
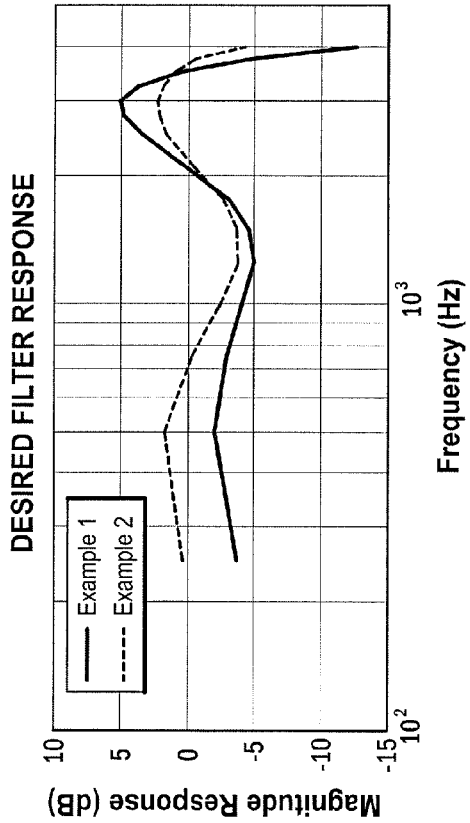
FIGS. 7a to 7i are a series of plots comparing the performance of a linear phase window filter design to a cepstral minimum phase approximation filter design.

FIGS. 7a to 7i are a series of plots comparing the results of non real-time filter design using the linear phase window design method of FIG. 4b, and a cepstral minimum phase approximation method. FIG. 7a shows two example target magnitude responses for the filter design process.

Figure 7C:
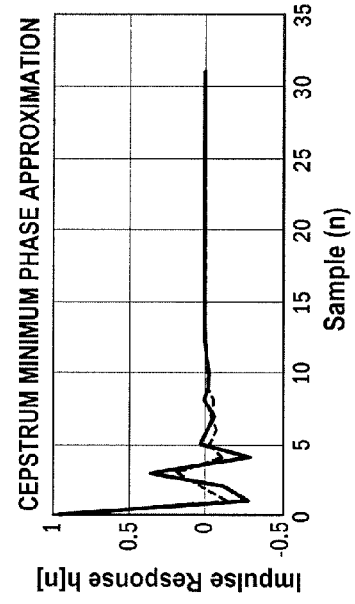
Figure 7B:
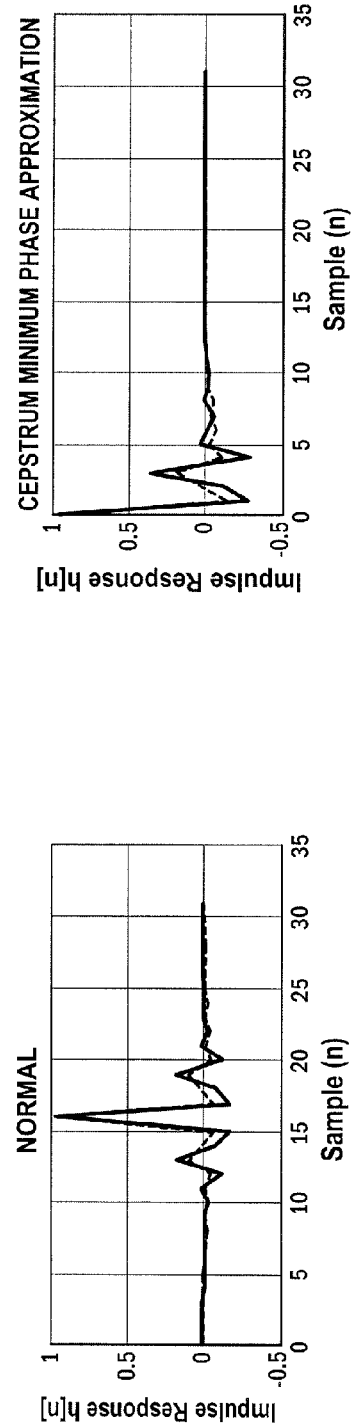
Figure 7D:
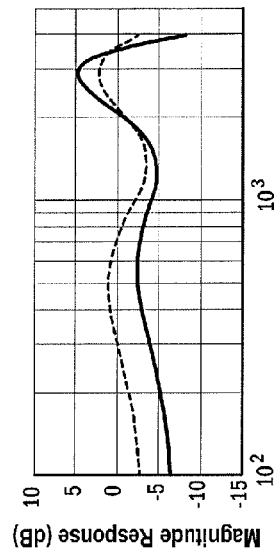

The synthesized filter impulse responses of the linear phase method and the cepstral minimum phase method are shown in FIGS. 7b and 7c, respectively. Note that the peak in the impulse response in the minimum phase case lies at the start of the finite impulse response window in FIG. 7c. The magnitude responses of the linear phase method and the cepstral minimum phase method are shown in FIGS. 7d and 7e, respectively, and are highly similar.

Figure 7F:
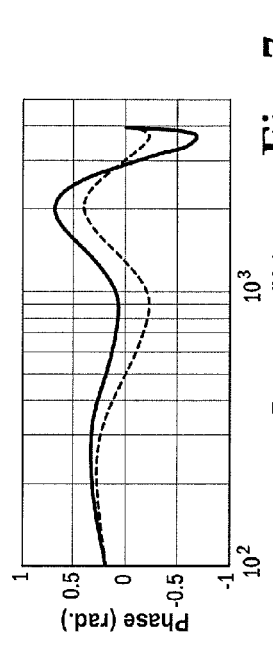
Figure 7E:
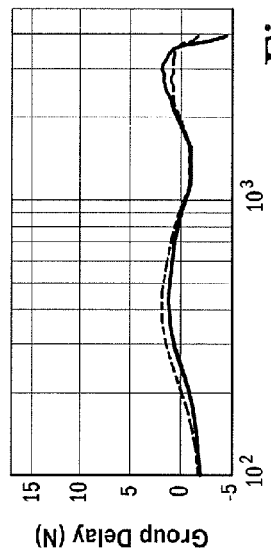
Figure 7H:
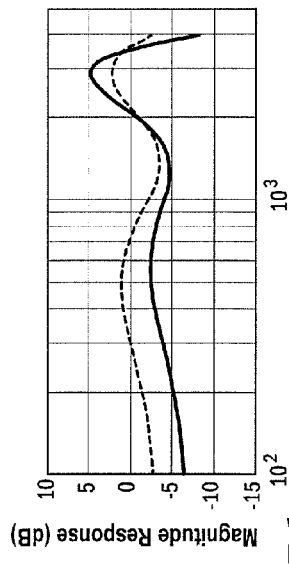
Figure 7G:
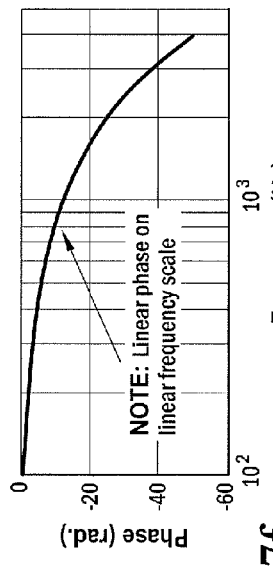
Figure 7I:
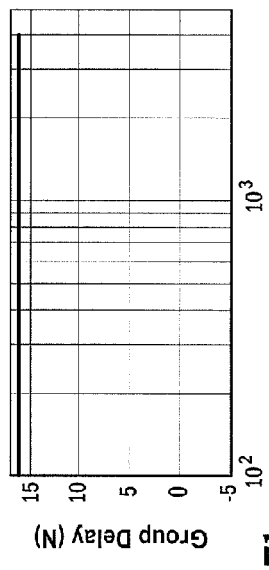

The resulting filter phases of the linear phase method and the cepstral minimum phase method are shown in FIGS. 7f and 7g, respectively. While the filter phase of the cepstral minimum phase filter is non-linear, it varies over a relatively very small phase range. The calculated filter group delay, in samples vs. frequency, of the linear phase method and the cepstral minimum phase method are shown in FIGS. 7h and 7i, respectively. FIG. 7i illustrates the very low or negative group delay for the cepstral minimum phase approximation method. The negative components suggest the filter is non-causal, but in reality this is not possible. In this respect, the group delay plot of FIG. 7a for non-linear phase systems is not necessarily an ideal representation of time delay. Instead, the variation in the group delay with frequency is what is known as 'group delay distortion'.

The present invention further recognises the possibility and advantages of applying and/or optimizing the properties of the cepstrum substantially in real time to provide for adaptive minimum phase filters. Such adaptive minimum phase filters may be particularly applicable for implementation of the filter 302 in the adaptive multi-band signal processing scheme of FIG. 3.

Figure 8:
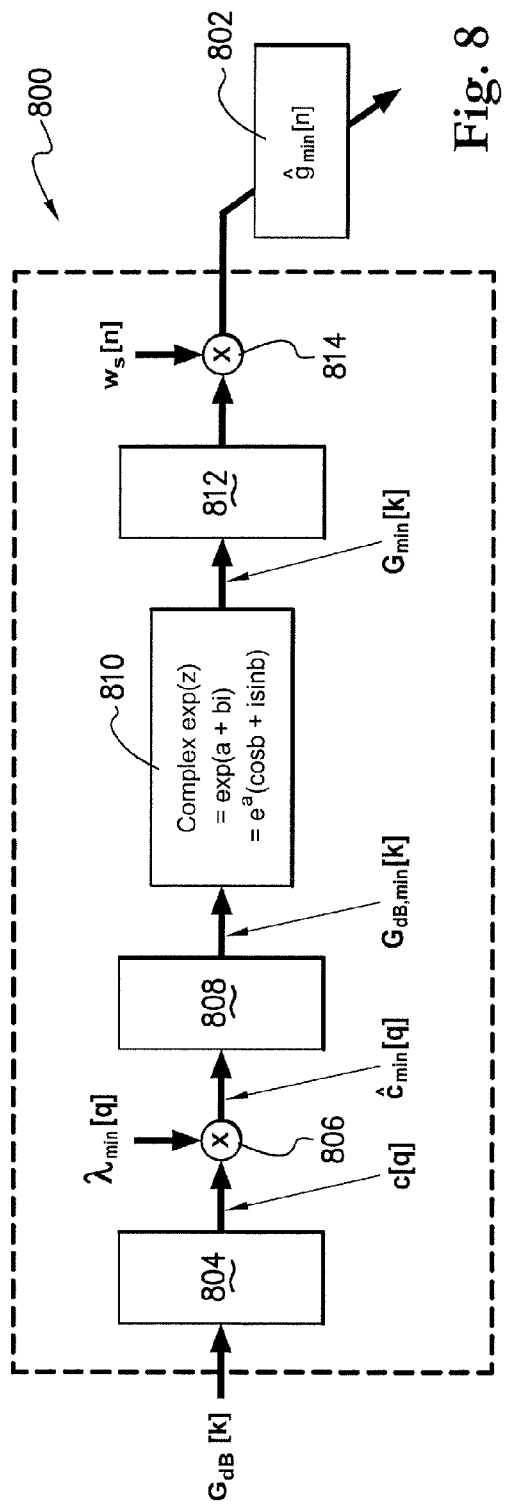
FIG. 8 illustrates a filter realisation block in accordance with a fourth embodiment of the invention.

FIG. 8 illustrates a filter realisation block 800 in accordance with a fourth embodiment of the invention, using the cepstral minimum phase approximation technique for filter realization in the type of structure depicted in FIG. 3. An important advantage in combining the structures of FIGS. 3 & 8 is that block 312 provides for the core processing to be performed in the log domain (dB or other basis) prior to gain calculation and filter realization. This is particularly convenient for cepstrum calculations which require the input to be in the log domain. Therefore, in the flow of FIG. 3, the filter gain specification given by the real logarithmic gain values $G_{dB}[k]$ can be input directly to IFFT 804 for initial calculation of the real cepstrum c[q] in the flow of the filter design process of FIG. 8.

Figure 9:
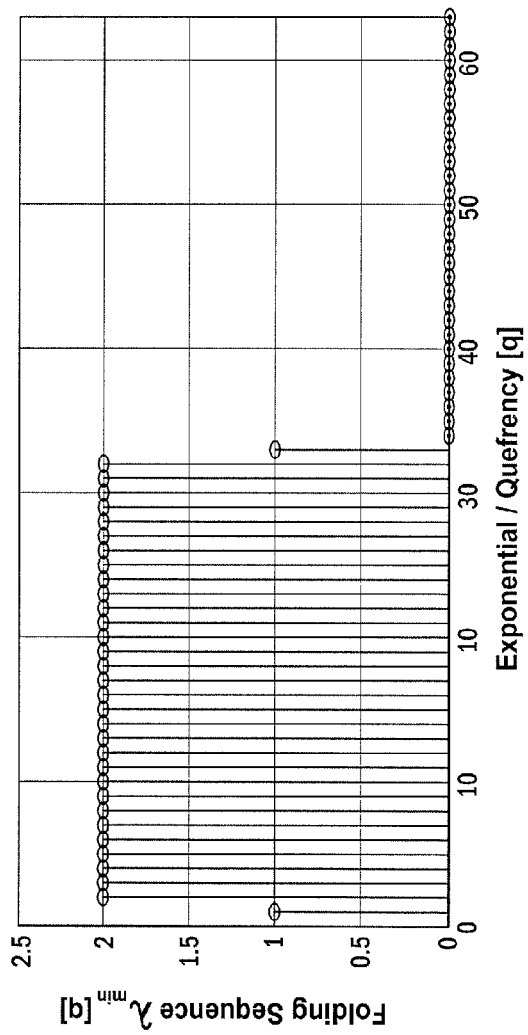
FIG. 9 illustrates a cepstral folding sequence for ensuring a cepstrum is causal in accordance with the fourth embodiment.

Once the real cepstrum c[q] of the log gain specification is calculated (c[q]=IFFT($G_{dB}[k]$)), it is element-wise multiplied at 806 by a folding sequence $\lambda_{min}[q]$ to produce a modified cepstrum $\hat{c}_{min}[q] = \lambda_{min}[q] \bigcirc c[q]$. In the present embodiment, the folding sequence $\lambda_{min}[q]$ is:

$$\lambda_{min}[q] = 1 \quad \text{for } q = 0 \text{ \& } L/2 + 1,$$
$$= 2 \quad \text{for } q = 1 \ldots L/2,$$
$$= 0 \quad \text{otherwise,}$$

where L is the window/FFT length, and q=0 . . . L−1. An example cepstrum folding sequence $\lambda_{min}[q]$ for the case of L=64 is plotted in FIG. 9.

The modified cepstrum $\hat{c}_{min}[q]$ is then input to FFT block 808 which calculates the complex logarithmic phase modified spectrum $G_{dB,min}[k]$ ($G_{dB,min}[k]$=FFT($\hat{c}_{min}[q]$)). To obtain the complex linear phase modified spectrum $G_{min}[k]$, the exponent of $G_{dB,min}[k]$ is calculated by block 810, so that $G_{min}[k]$=exp($G_{dB,min}[k]$). In the case where $G_{dB}[k]$ was calculated with a natural logarithm basis, the direct form of Euler's relation for z=a+bi can be used:

$$\exp(z)=e^z=e^a(\cos b + i \sin b)$$

Similar, alternative forms of this relation can be used when $G_{dB,min}[k]$ is in an alternative or adjusted logarithm basis domain (e.g. base 2 or dB).

IFFT block 812 then returns the complex linear phase modified spectrum $G_{min}[k]$ to the time domain, where it is windowed at 814 with a appropriate synthesis window $w_s[n]$ to produce an approximate minimum phase impulse response to define the filter 802 as a minimum phase filter $\hat{g}_{min}[n]$= IFFT($G_{min}[k]$) $\bigcirc w_s[n]$.

Care is required in FIG. 8 regarding the choice of an appropriate synthesis window function $w_s[n]$. Because the un-windowed minimum phase impulse response is not symmetric, and typically peaks very early in the finite filter length, a convenient window function to obtain well controlled spectral smoothing may not be apparent. As comparison, FIG. 5(c) demonstrates the importance of the window function and spectral smoothing to the magnitude response of the filter in the symmetric, linear phase case.

Figure 10A:
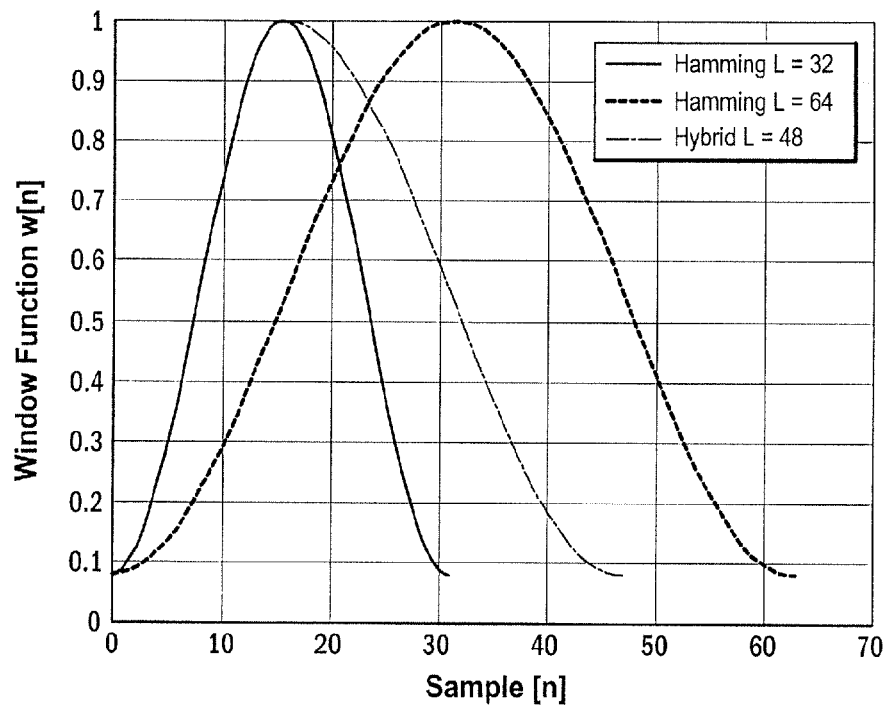
FIGS. 10a and 10b respectively illustrate symmetric and asymmetric synthesis windows, and the normalised magnitude responses of the synthesis windows.
Figure 10B:
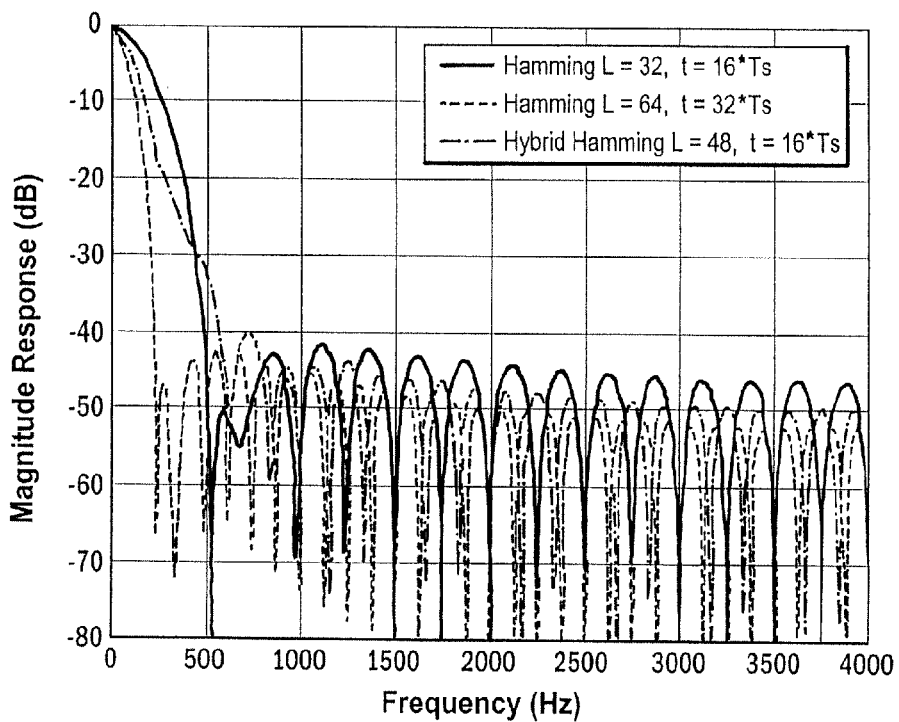

For the case where the minimum phase impulse response is expected to peak at the start, an initial solution might be to apply an asymmetric window such as the tail side of a conventional window function, e.g. a Hamming window or Hanning window or the like, padded with zeros, for use as the synthesis window function $w_s[n]$. This has been trialled, but in practice suffers several problems. Because the effective peak location or group delay of the minimum phase impulse response is not constant, the effect of the window function on the final magnitude response will vary as the input magnitude response itself varies. Furthermore, a single sided asymmetric window function loses much of the spectral resolution of its symmetric counterpart. FIG. 10 shows the window functions (FIG. 10a) and resulting normalised magnitude responses (FIG. 10b) for L=32 & L=64 single sided asymmetric Hamming windows, compared with an L=64 symmetric Hamming window, when used in the filter realisation block 800. These outputs can be compared to the window asymmetry effects seen in FIG. 6.

While these or other windows may in some embodiments of the invention prove suitable for appropriate applications, an alternate cepstral implementation of filter realisation has been recognised by the fifth embodiment of the present invention. Rather than attempt to choose or synthesize an asymmetric time domain window $w_s[n]$, spectral smoothing of the filter specification is obtained by recognising and exploiting another property of the cepstrum, referred to as cepstral smoothing, cepstral homomorphic filtering or 'liftering'. The goal of such smoothing is to apply a low-pass or single sided function to weight the ends of the cepstrum. Since the 'high exponential' or 'high quefrency' components of the cepstrum generally represent the faster variations in the spectral domain, the spectrum can be smoothed if these components are weighted down relative to the 'low exponential' or 'low quefrency' components.

Cepstral filtering is therefore ideal for smoothing the minimum phase spectrum prior to truncation for the finite impulse response in the adaptive filter design application of the present invention. Indeed, the present embodiment recognises that the operation to perform the smoothing can be the same operation which applies the cepstral folding sequence to obtain the filter minimum phase. This is an elegant solution, since improved spectral smoothing can be obtained compared to use of a time domain asymmetric window $w_s[n]$, while at the same time computational complexity and memory requirements are reduced.

In the present embodiment the cepstral smoothing or littering sequence $\phi_s[q]$ for spectral smoothing of the filter magnitude response exploits a reverse Hamming function without padding:

$$\phi_s[q]=0.54+0.46\cos(2\pi q/L)$$

where L is the window/FFT length, and q=0 ... L−1. Other sequences for cepstral smoothing and folding are also possible. Since this smoothing sequence can be applied to the cepstrum in the same operation in which the folding sequence $\lambda_{min}[q]$ is applied, a single combined folding and smoothing sequence $\psi_{min}[q]$ is simply derived by the element-wise multiplication:

$$\psi_{min}[q]=\lambda_{min}[q] \odot \phi_s[q]$$

Figure 11:
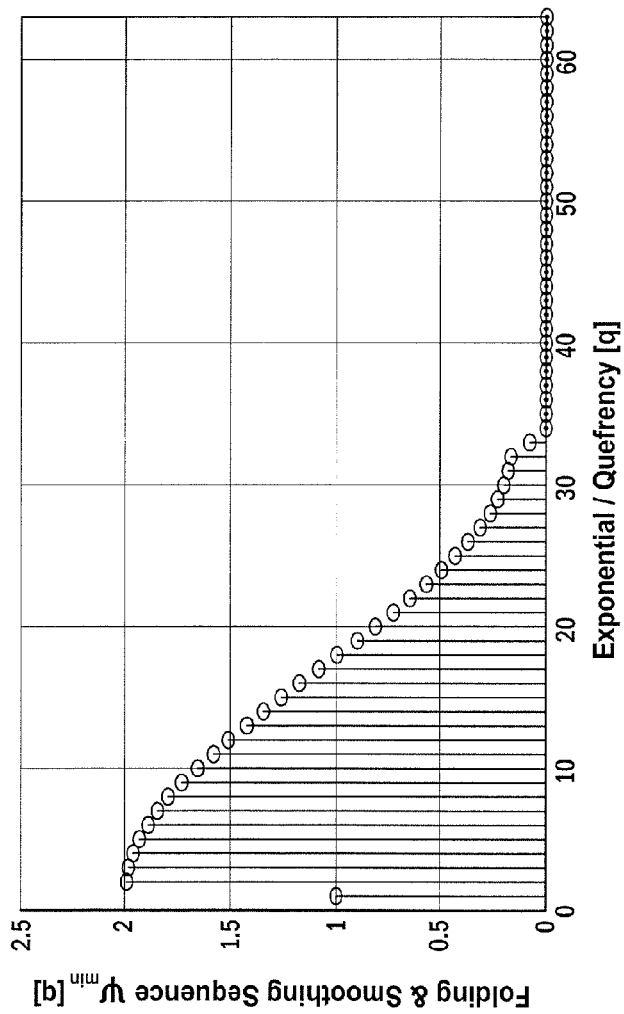
FIG. 11 illustrates a cepstral folding and smoothing sequence for ensuring a cepstrum is causal and spectrally smoothed in accordance with a fifth embodiment of the invention.

An example plot of the combined folding and smoothing sequence $\psi_{min}[q]$ for L=64 is shown in FIG. 11.

Figure 12:
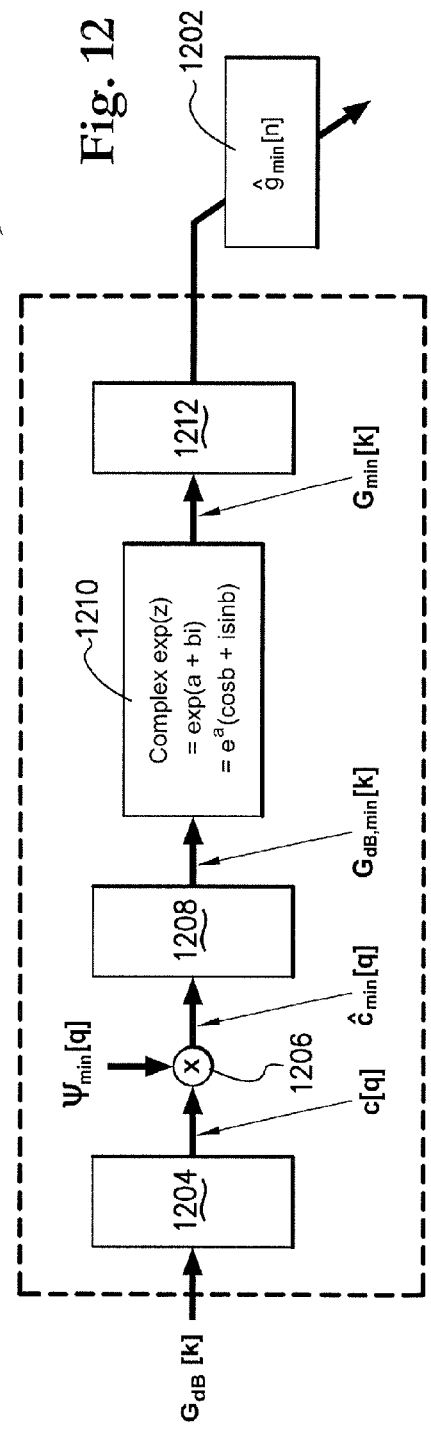
FIG. 12 illustrates a filter realisation block in accordance with the fifth embodiment of the invention.

Utilising such an optimised cepstral folding and smoothing technique provides for a real time adaptive filter realisation block 1200 as shown in FIG. 12. In that filter realisation, the logarithmic desired gains $G_{dB}[k]$ are converted to the real cepstrum $c[q]$ by IFFT block 1204 so that $c[q]=\text{IFFT}(G_{dB}[k])$. At 1206 the cepstrum $c[q]$ is element-wise multiplied by the combined cepstral folding and smoothing sequence $\psi_{min}[q]$ to generate the modified cepstrum $\hat{c}_{min}[q]=\psi_{min}[q] \odot c[q]$. The modified cepstrum $\hat{c}_{min}[q]$ is then input to FFT block 1208 to obtain the complex phase modified smoothed logarithmic spectrum $G_{dB,min}[k]=\text{FFT}(\hat{c}_{min}[q])$, from which the linear complex phase modified smoothed spectrum $G_{min}[k]$ is determined by block 1210, which takes the exponential so that $G_{min}[k]=\exp(G_{dB,min}[k])$. The linear complex phase modified smoothed spectrum $G_{min}[k]$ is then returned to the time domain by IFFT 1212, to produce an approximate minimum phase impulse response to define the filter 1202 as a minimum phase filter $\hat{g}_{min}[n]=\text{IFFT}(G_{min}[k])$.

The filter synthesis of the embodiment of FIG. 12 thus involves simplified processing compared to the embodiment of FIG. 8, by eliminating synthesis windowing in the time domain. This method further provides improved smoothing of the specification filter spectrum and reduced computational complexity over the scheme in FIG. 8.

The present invention thus recognises and overcomes a number of issues in order to use the cepstral minimum phase approximation for real time multi-band processing. In particular, the use and implementation of a suitable host processing structure such as the structure of FIG. 3, the efficient implementation of the additional computational steps required, including FFT/IFFT's, logarithm, and the complex exponential, the choice of filter synthesis window function or spectral smoothing means, maintaining constraints on filter phase distortion and temporal variation for a given application, and optimising filter errors and synthesis behaviour for large and/or fast magnitude response variations.

An important issue with the real time filter design structures of FIGS. 4, 8 and 12 is that the design process only produces a filter $\hat{g}[n]$ that has the approximate magnitude response of the gain specification $G_{dB}[k]$. The approximation error for each synthesized filter is dependent on both the input gain specification $G_{dB}[k]$ and the design method. Typically, filter specifications $G_{dB}[k]$ with particularly large levels of variation (eg multiple notch filters) will be realized less accurately than a spectrally smooth filter specification. FIG. 5(c) demonstrates some of these magnitude response errors.

An additional set of important effects are also unique to the filters designed by the schemes of FIGS. 8 and 12. Because these filters have non-linear, time varying phase, the group delay can actually vary with time and frequency, dependent on the input gain specification $G_{dB}[k]$. This variation also tends to be more marked when the variation in the gain specification across frequency is large. That is, when large peaks or troughs (notches) appear in the input gain specification, the synthesized approximate minimum phase will have greater variation, and the group delay and group delay variation tend to increase. Importantly however, in implementations and testing to date such variation has not been found to be perceivable, or significant in any other sense. Note that this may also be an advantage, since the natural phase variation with time is less likely to support feedback, for example.

Figure 13A:
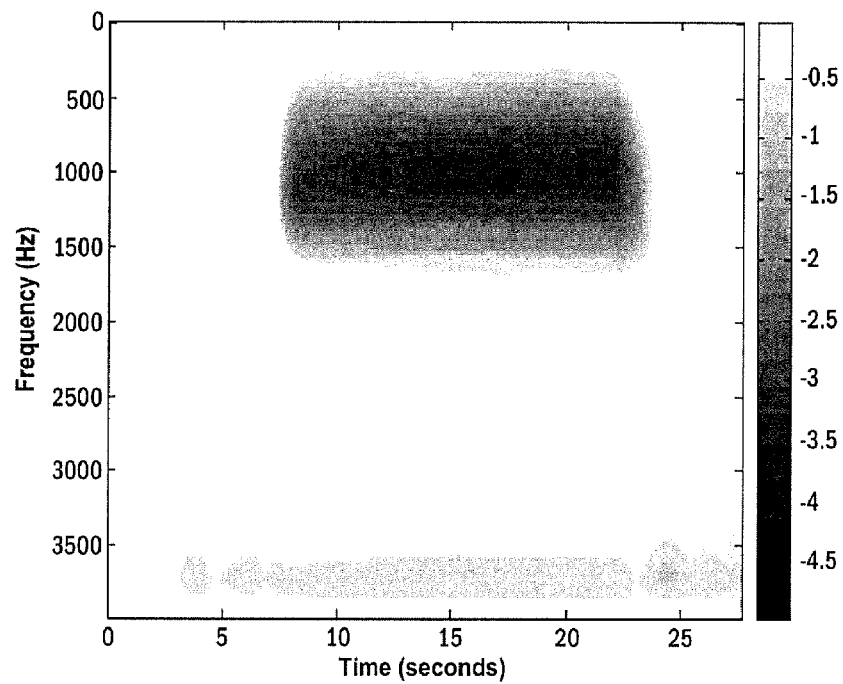
FIGS. 13a and 13b are spectrograms illustrating the variation in phase and group delay, respectively, in the response to a speech+alarm signal of an adaptive filter in accordance with the fifth embodiment.

FIG. 13 illustrates some of these effects. FIG. 13a is a plot of phase (in radians) vs. frequency and time for a time varying filter implemented with cepstral techniques and adapted by way of the ADRO algorithm in response to a speech+alarm input signal. The alarm signal occurs relatively centrally in time, over a relatively narrow frequency region of the input signal. ADRO tends to introduce strong attenuation in the time and frequency location of the alarm relative to the gains for the rest of the input. Note that the phase 'trough' in FIG. 13a, generally in the region of 1000 Hz over the time period 8-22 seconds, is the largest variation in phase and is roughly in a common time and frequency location with the location of the alarm components in the input signal and is thus associated with the ADRO compensating gain reduction.

Figure 13B:
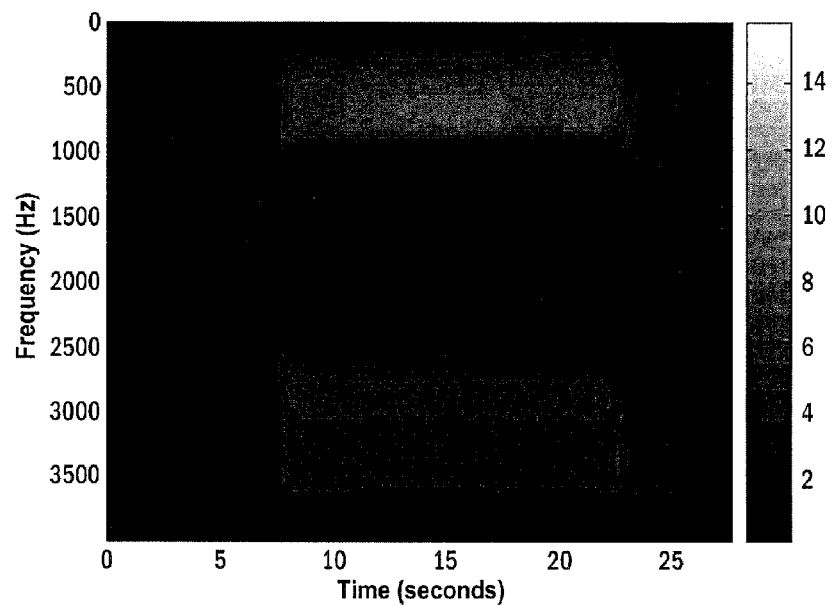

FIG. 13b shows the effect of this phase variation on the filter group delay (in samples, limited to 0 minimum) vs. time and frequency. For the duration of the alarm and the ADRO attenuation, the group delay of the neighbouring (un-attenuated) frequency regions is apparently increased. However, the group delay is nevertheless relatively very low throughout the whole spectrum for the duration of the signal.

In practice, a number of measures can be taken in a processing scheme similar to that depicted in FIG. 3 to allow for a variety of design approximation or error effects. These measures can be classed as either preventative to avoid occurrence of the effects, or as compensatory to analyse and reduce the possible consequences of occurrence of the effects.

Such preventative measures can be targeted at reducing the rate of gain variation in the filter specification $G_{dB}[k]$ across sub-bands, so that the synthesized filters are more likely to attain the peaks or troughs of the gain specification. Particularly for the purposes of applying sufficient attenuation to limit output levels, adjustment of $G_{dB}[k]$ prior to filter synthesis can assist in the filter obtaining the levels of attenuation in the minima of the gain specification. These measures include application of minimum and maximum gains over $G_{dB}[k]$, and/or further spectrally smoothing $G_{dB}[k]$, to reduce relative gain variation.

Compensatory measures are normally based on measuring the extent of gain errors, and compensating the output or specification $G_{dB}[k]$ accordingly. These measures usually form part of a more sophisticated gain control mechanism on the specification $G_{dB}[k]$ prior to the filter realization means in FIG. 3, or as an alternative to FIG. 3 in which feedback is provided. Specific measures forming part of a more advanced gain control in FIG. 3 include implementing a feed-back path from the output signal after filter application, to a gain controller that can analyse the effective difference between desired and attained gain levels, and further compensate $G_{dB}[k]$ to optimize the filter to specific criteria (eg guaranteeing minima for limiting purposes).

Another class of measure predicts a particular level of gain variation that can be successfully attained by the filter design, and applies appropriate additional filtering measures in the signal path for levels of gain variation that exceed the maximum. These additional filtering measures can also include simply additional full-band gain, or additional adaptive IIR or FIR filters for example.

Note that a feed-back form of the structure in FIG. 3 naturally reduces error by operating in closed loop form. Such a structure is depicted in FIG. 14. This structure is particularly well suited to applications where the core processing is output referred and/or varies gain at relatively slower rates, since the feedback, closed loop form is subject to stability constraints imposed by the analysis rate. ADRO processing in a hearing aid, with slower time constants and slower acting maximum output limits, is likely to be well suited to this form of the scheme.

Further, the cepstral minimum phase design mechanisms of FIGS. 8 and 12 in particular require a number of additional signal processing stages over the linear phase design mechanisms in FIG. 4. These additional stages include an additional FFT, IFFT, and the complex exponent. An important feature of the schemes of FIGS. 8 and 12 is that they can exploit the very efficient FFT/IFFT hardware blocks often provided in modern audio digital signal processors. Therefore, the processing for the additional FFT/IFFT required in these schemes can be performed almost 'for free' on such DSP architectures, that is, at very low additional computational complexity and power cost. Even in modern DSP's without FFT/IFFT hardware assistance, the additional load to perform an additional FFT/IFFT at the analysis or filter design rate required for many audio conditioning algorithms such as ADRO is typically very low, particularly as a percentage of the resources available.

The complex exponential of blocks 810 and 1210 therefore often becomes the most computationally complex additional requirement for the schemes in FIGS. 8 and 12. By Euler's relation, calculation of the complex exponential is accomplished by calculation of a standard exponential of a real number (the real part), combined with calculation of the sine and cosine of another common real number (the imaginary part). That is, $\exp(z)=\exp(a+bi)=\exp(a).(\cos b+i \sin b)$. It is noted that a further advantage of the schemes of FIGS. 3, 4, 8, 12 and 14 is that many modern digital signal processors provide hardware assistance for the calculation of the real logarithm and exponent, at least in base 2. Therefore, the real logarithm and exponent at another basis can be performed very efficiently by usage of the hardware assisted function, combined with an appropriate factor. For the case of a natural basis log gain specification $G[k]=z=a+bi=\log_n(c+di)$, and an available base 2 exponential function, the present invention recognises that the complex exponent can be calculated in a straightforward manner:

$$c+di=2^{a.\log 2c}.(\cos b+i \sin b)$$

However, the log gain specification is often effectively in a basis other than natural (base 2 or dB for example). Therefore, in the generalized case where the gain specification $G[k]=z=a+bi=p.\log_k(c+di)$, and the base 2 exponential is available, we have:

$$c+di=2^{a.\log 2(k)/p}.(\cos(b.\log_n(k)/p)+i \sin(b.\log_n(k)/p))$$

For example, when $G[k]$ is in dB, $$G_{dB}[k]=a+bi=20 \log_{10}(c+di),$$

$$c+di \approx 2^{0.1661*a}.(\cos(0.1151*b)+i \sin(0.1151*b))$$

The remaining task is to calculate the sine and cosine of the imaginary part This can be relatively easily accomplished by common approximation methods such as an interpolated look-up table, polynomial approximation, or CORDIC (COordinate Rotation DIgital Computer) algorithm for example. The approximation is often optimized to find both sine and cosine at the same time, and to minimize a particular form of approximation error, eg max or mean error in sine or cosine component, or the combined error (sum of squares for example). In the case of the current application, minimization of error in the resultant magnitude (sum of squares) is likely to be most desirable, since magnitude errors are likely to be more significant than phase errors.

The cepstral minimum phase schemes of FIG. 8 or 12 were tested in simulations using Matlab. This testing has focused on comparing the performance of the schemes of FIGS. 4, 8 and 12 when combined with the structure of FIG. 3, while processing signals with the ADRO algorithm. A number of 'corner case' input signals and ADRO configurations and fittings were trialled to validate and compare the methods.

FIGS. 15a and 15b illustrate the simulated power spectral density, and simulated cross correlation, respectively, of the third and fourth embodiments of the invention in response to an input signal. The ADRO algorithm was applied to an input speech signal using the third embodiment (of FIG. 4b) and fourth embodiment (of FIG. 8), respectively. A length 128 filter/FFT length was used to effectively provide 65 ADRO channels, with a sample rate of 16 kHz, for an extreme set of hearing aid target parameters. FIG. 15(a) shows a plot of the power spectral density of the input signal, and the output signals for the third and fourth embodiments. It is noted that the hearing aid fitting causes a heavy high frequency emphasis in the output, but both the symmetric linear phase output of the third embodiment, and the cepstral minimum phase output of the fourth embodiment, have nearly identical power spectral densities. Informal listening tests also indicated there was no perceivable difference between the outputs, and that they were each consistent with correct operation for ADRO. FIG. 15(b) shows the relevant cross correlation lags, for the cross correlation of each output with the input. The peak locations in these plots show that while the measured signal delay of the third embodiment linear phase version is around 4 ms, the measured signal delay of the fourth embodiment cepstral minimum phase version is very low, around ~0.1 ms.

Further modeling was performed to examine the relative gain accuracy of the filter design schemes in more detail. The third embodiment (linear phase) and fourth and fifth embodiments (cepstral minimum phase) were used in a test case with ADRO and a speech input combined with a high level narrowband alarm signal for part of the signal. A telephony ADRO fitting was used with a sample rate of 8 kHz, and filter/FFT length of 32, for effectively 17 processing channels. FIG. 16 compares some of the results for the time varying magnitude response of each scheme.

Figure 16A:
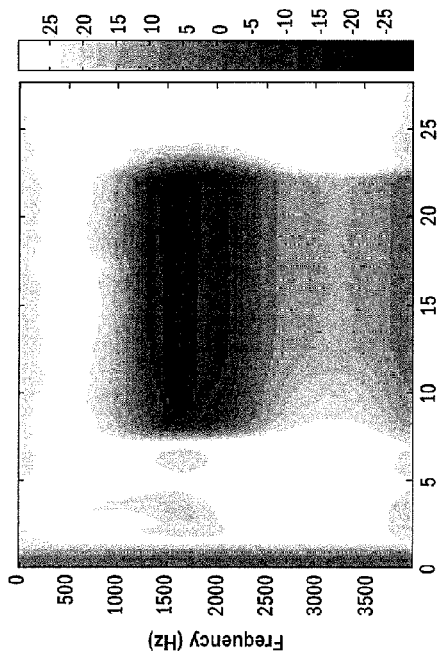
FIG. 16a is a spectrogram of an input gain specification.
Figure 16B:
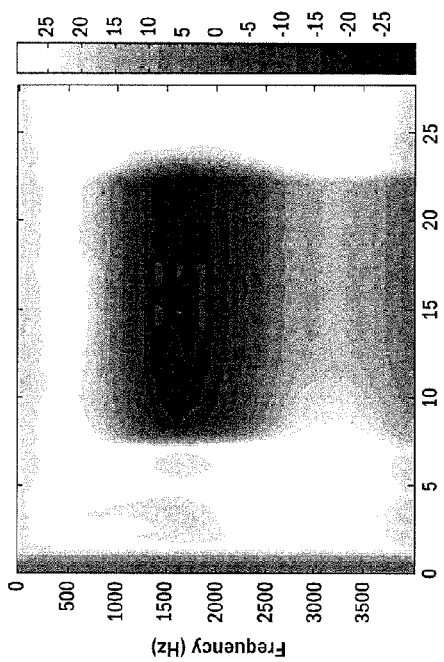
FIGS. 16b to 16g are spectrograms illustrating the response and response errors of the third, fourth and fifth embodiments of the invention.
Figure 16C:
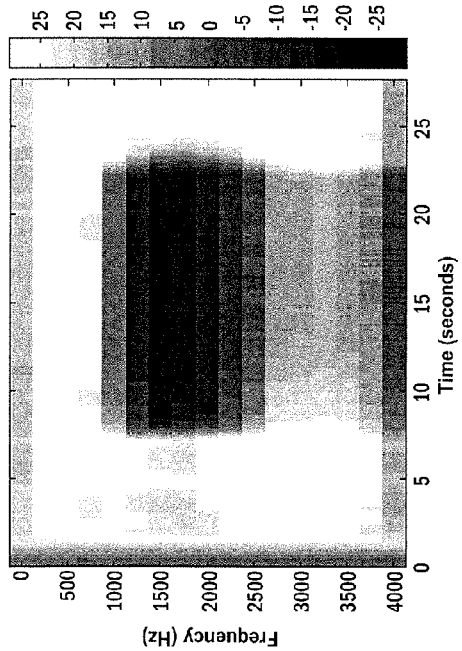
Figure 16D:
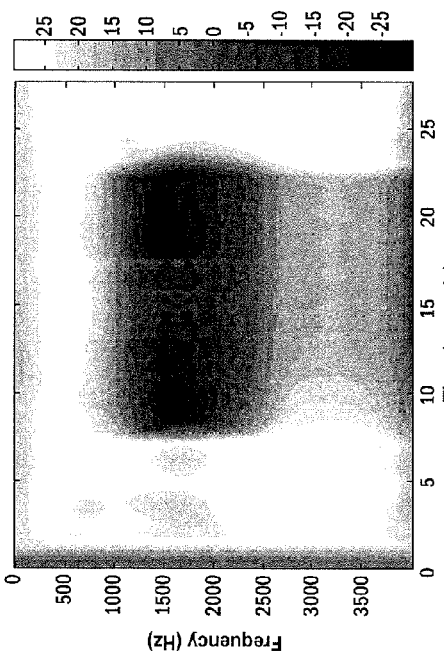
Figure 16E:
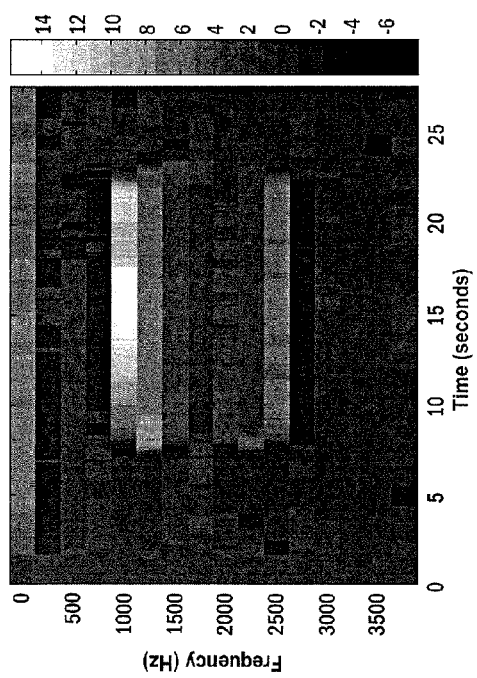
Figure 16G:
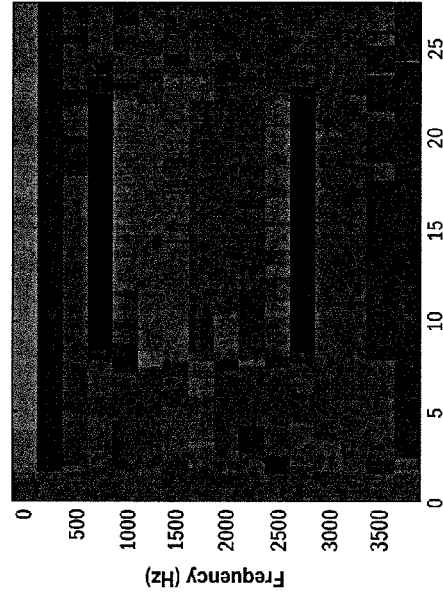
Figure 16F:
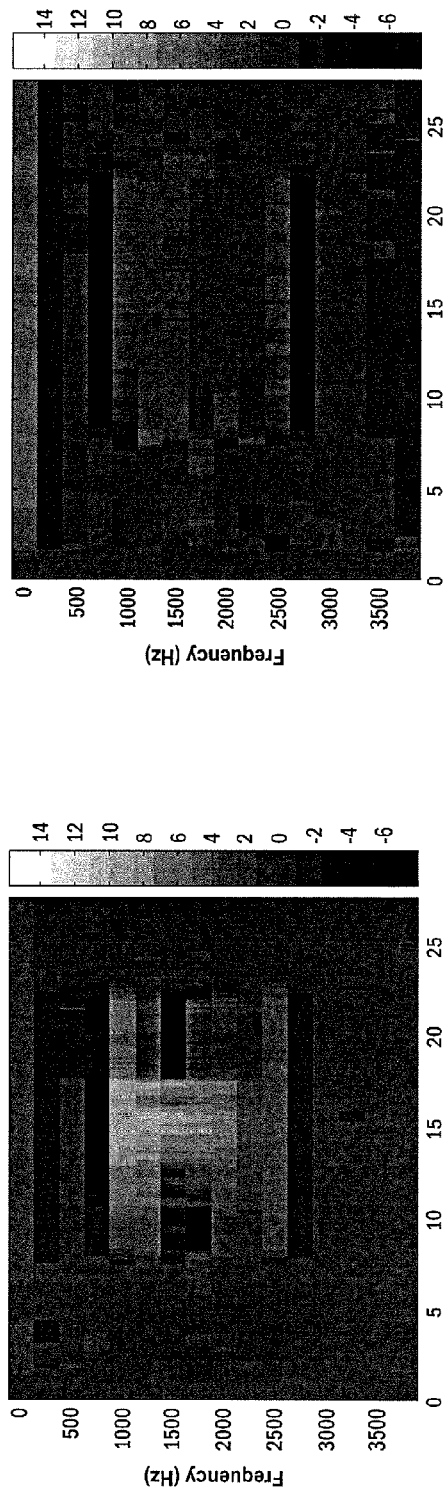
Figure 17:
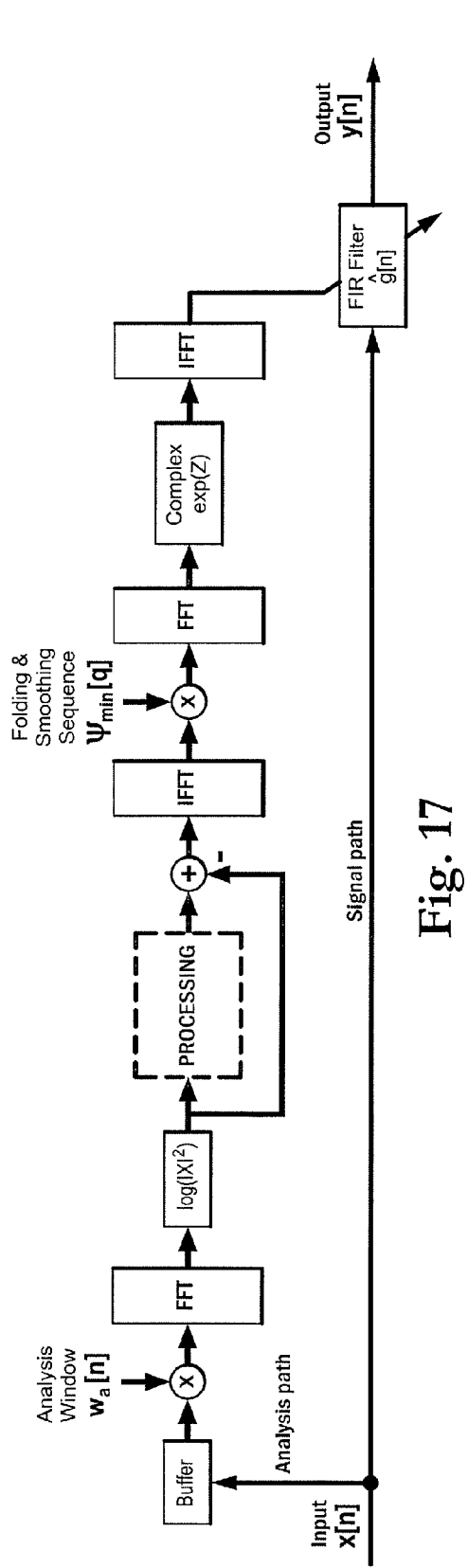
FIG. 17 is a block diagram illustrating implementation of the filter realisation block of FIG. 12 within the circuit of FIG. 3.

FIG. 16(a) shows the original ADRO gains forming the input gain specification (i.e. desired gains) in dB vs. time and frequency. FIGS. 16(b) to (d) show the time varying magnitude response of the filter in dB for the embodiments of FIG. 4b, FIG. 8 and FIG. 12, respectively. Panels 16(e) to (g) show the corresponding gain errors in dB when the magnitude responses of FIGS. 16(b) to 16(d) are compared with the original gain specification in 16(a). Measured characteristics for each embodiment are given in the table below:

|  | Third Embodiment | Fourth Embodiment | Fifth Embodiment |
| --- | --- | --- | --- |
| RMS error (dB): | 3.03 | 2.43 | 1.77 |
| Max. \|error\| (dB): | 15.35 | 21.71 | 6.31 |
| Mean delay (ms): | 2.00 | 0.23 | 0.17 |

These characteristics, and the plots of FIG. 16, show that not only does the cepstral minimum phase scheme of the fifth embodiment cause much lower group delay than the linear phase scheme of the third embodiment, but both rms and maximum absolute gain errors are also reduced. Importantly, this suggests the combined cepstral smoothing and minimum phase translation not only improves group delay but improves the performance of the filter magnitude response as well.

The results indicated by FIG. 16 have been further explored by exposing the linear phase third embodiment and cepstral minimum phase fifth embodiment to a wider array of conditions while processing the ADRO algorithm. FIGS. 22 to 26 provide more detail on this testing.

The case study simulations were performed using a non-real time model of the signal processing systems in Matlab. A structure similar to FIG. 3 was implemented, and the third embodiment (FIG. 4b), fourth embodiment (FIG. 8), and fifth embodiment (FIG. 12) filter synthesis schemes were separately trialled in the structure to compare performance. Because the immediate end application of the invention is processing of the ADRO audio processing algorithm, the schemes were trialled in a series of practical ADRO configuration and input signal scenarios. These configurations included:

1. Telephony ADRO, fast adaptive gain slew rates, L=32, 17 channels, 8 kHz sample rate;
2. Hearing aid ADRO, fast adaptive gain slew rates, L=128, 65 channels, 16 kHz sample rate; and
3. Hearing aid ADRO, fixed slow slew rates, L=128, 65 channels, 16 kHz sample rate.

Figure 22A:
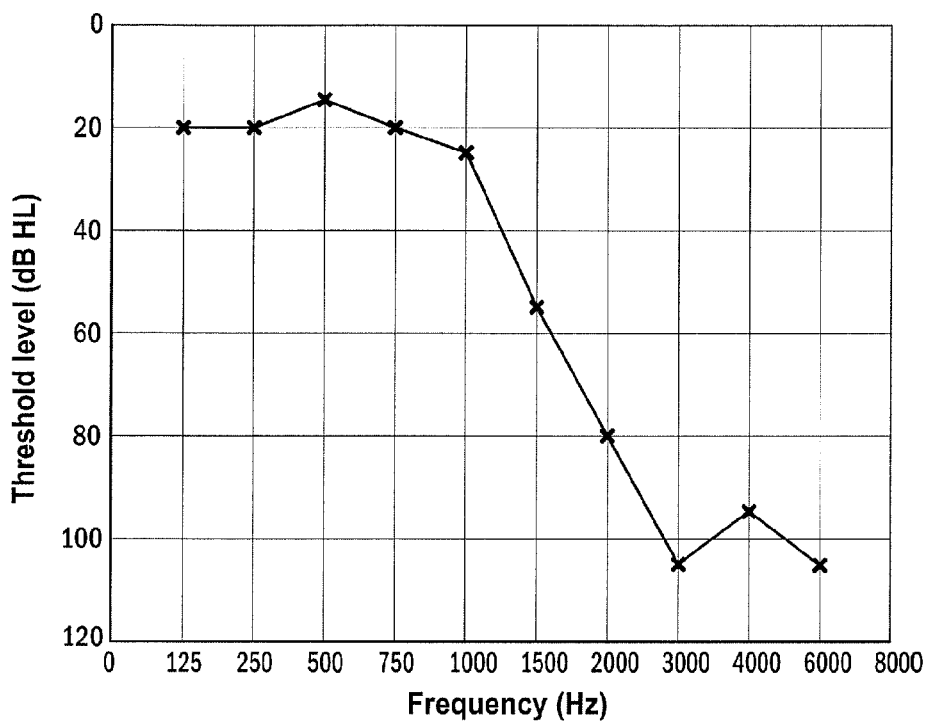
FIG. 22a is a relatively extreme audiogram.
Figure 22B:
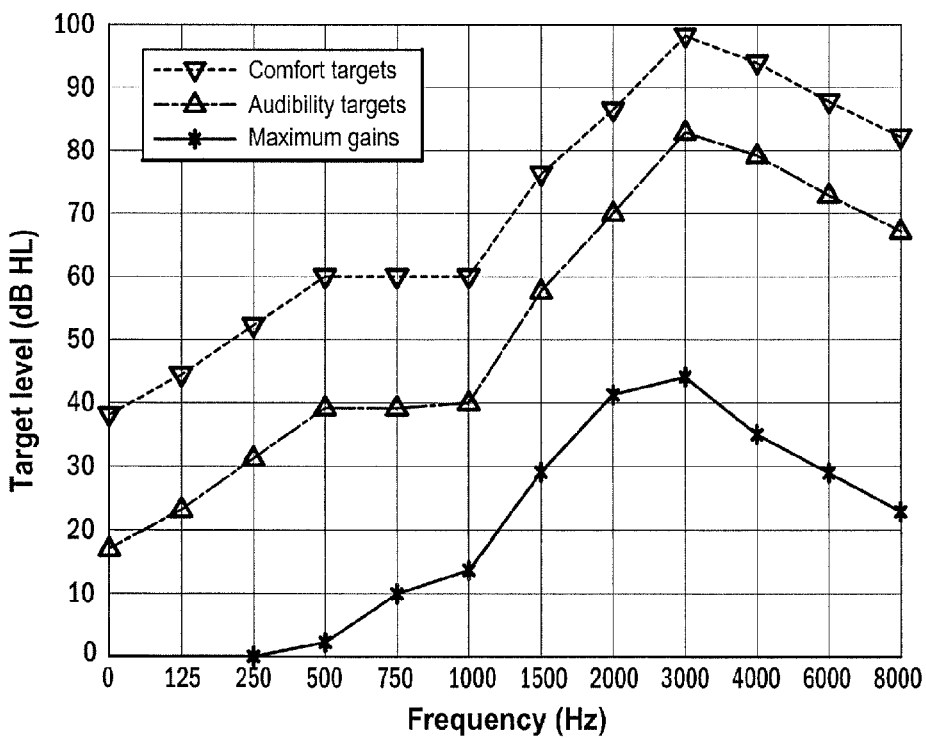
FIG. 22b illustrates an ADRO fitting for such an audiogram, in respect of which the case study simulations of FIGS. 24 and 26 were obtained.

Note that several ADRO 'fittings' or target parameter sets were trialled for the hearing aid configurations. A key test case was a relatively extreme fitting for a severe audiogram developed in an actual fitting with a subject. This audiogram and the corresponding ADRO parameters are shown in FIG. 22. FIG. 22a is the relatively extreme audiogram, and FIG. 22b illustrates the ADRO fitting parameters for such an audiogram.

A series of audio test signals were applied in the simulations to obtain ADRO's natural response in terms of gain vs. time and frequency. The input signals tested included:

4. Several speech only signals;
5. Several speech signals with high or low frequency emphasis;
6. A speech signal with additional high level alarm during part of the speech period; and
7. Acoustic shock protection testing signals from the Telstra TT4 specification.

The case study results of Table 1 below were composed from testing the ADRO configurations (1) and (2) (with extreme fitting), and input signals (4) and (6). A fill set of additional plots showing the time order behaviour of the input gain specification produced by ADRO, and the resulting behaviour of the third embodiment and fifth embodiment, is shown for each case study in FIGS. 23 to 26, in which plots of the performance of the third embodiment are on the left (e.g. FIGS. 23b, 23d, 23f, 23h and 23j), while plots of the performance of the fifth embodiment are on the right (e.g. FIGS. 23c, 23e, 23g, 23i and 23k).

Figure 23A:
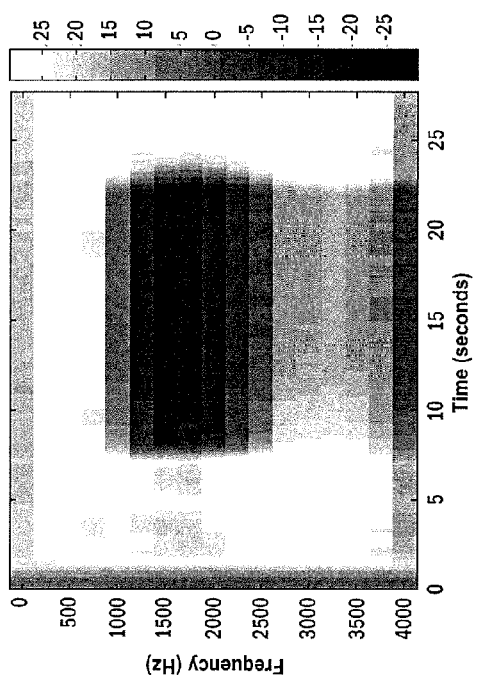
FIGS. 23a to 23m illustrate the performance of the third and fifth embodiments of the invention under a telephony fitting of ADRO for normal hearing, in response to a speech+alarm input signal.
Figure 23C:
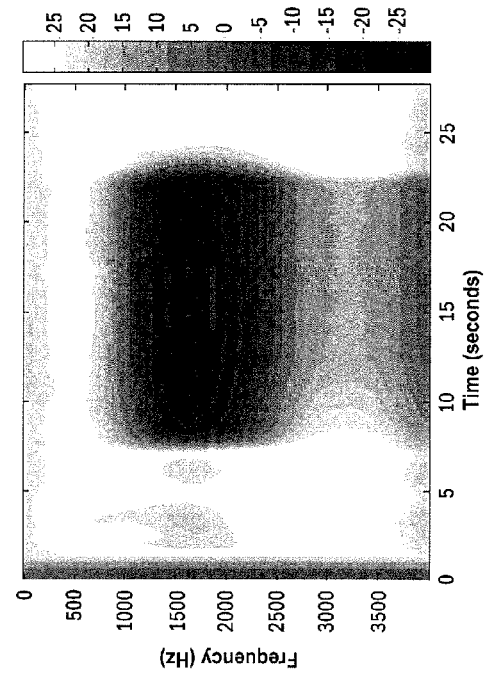
Figure 23B:
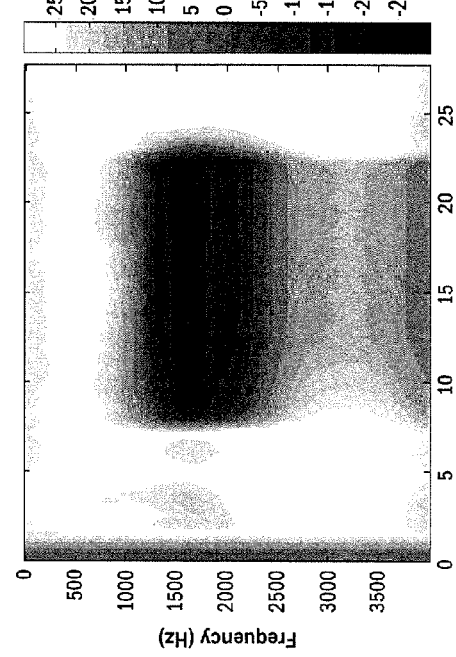
Figure 23D:
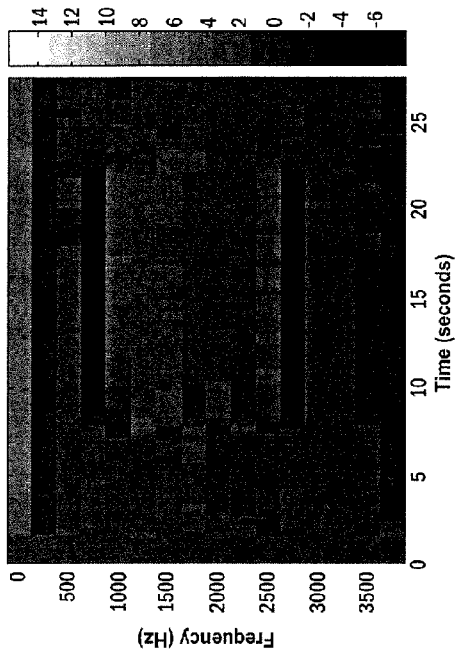
Figure 23E:
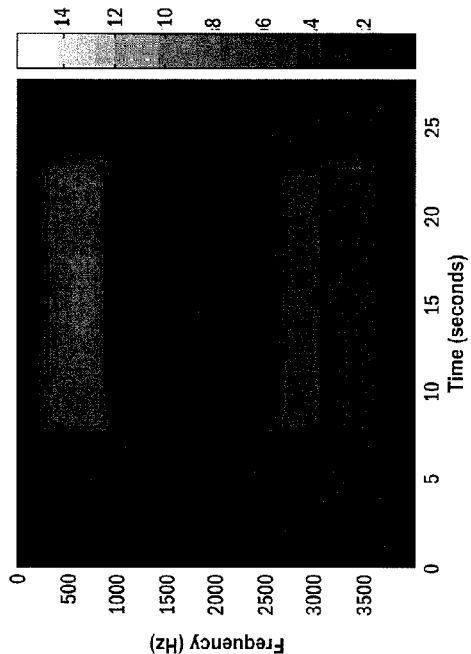
Figure 23F:
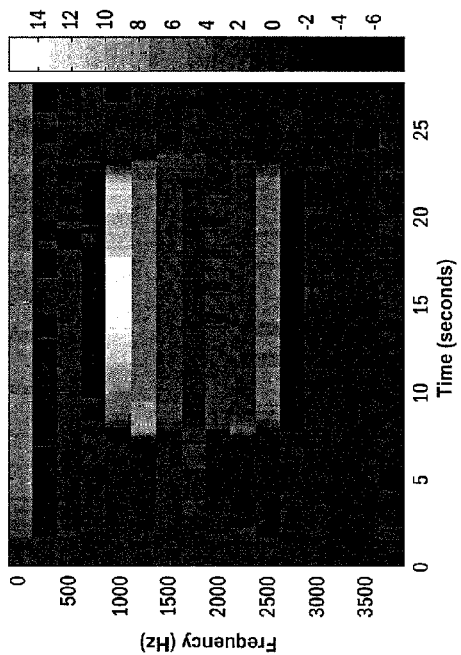
Figure 23G:
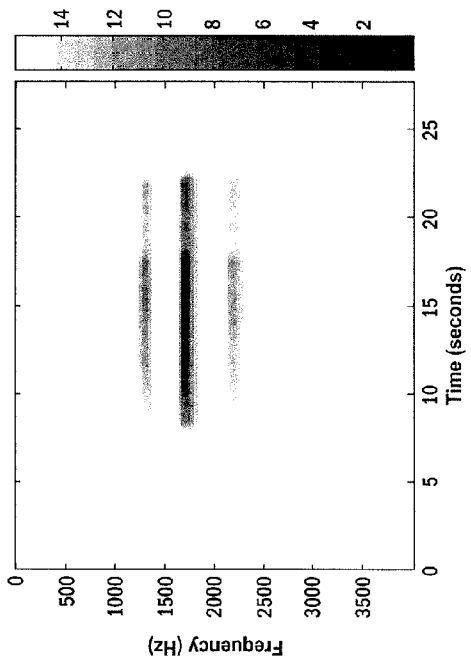
Figure 23H:
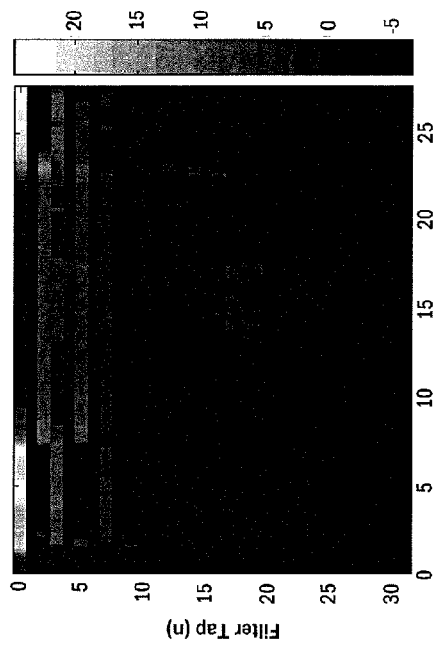
Figure 23I:
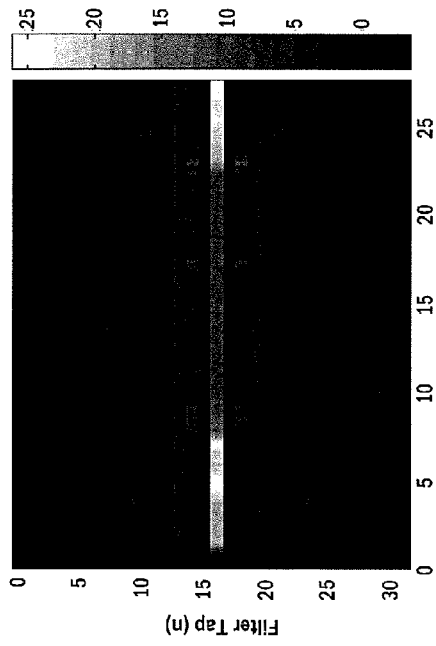
Figure 23J:
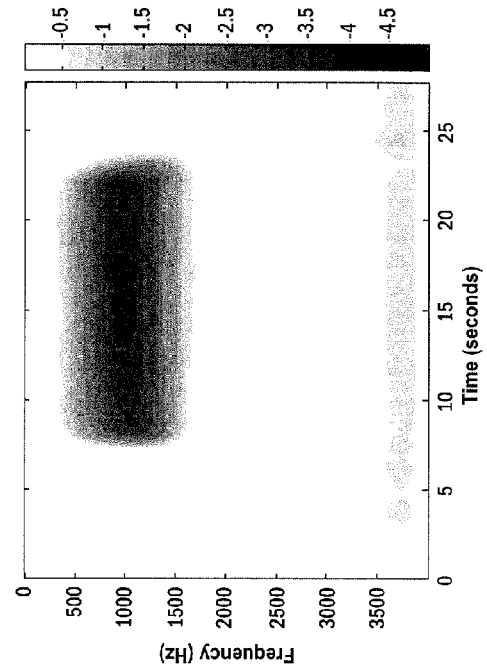
Figure 23K:
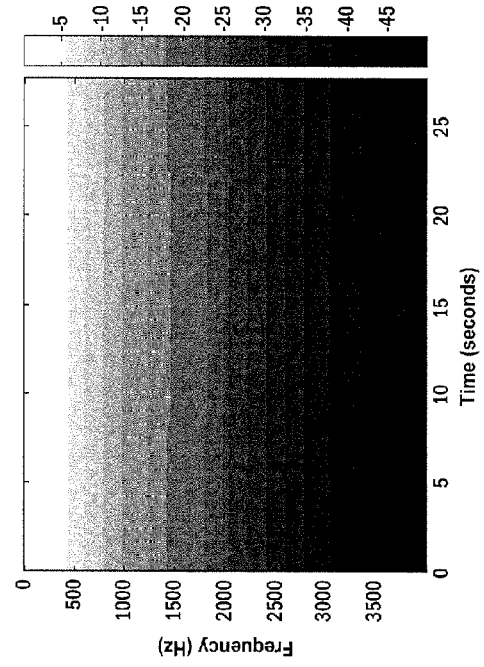
Figure 23M:
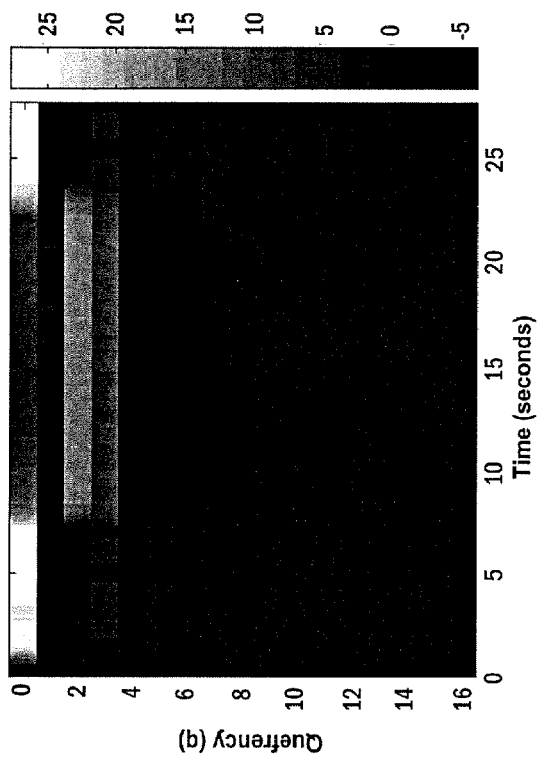
Figure 23L:
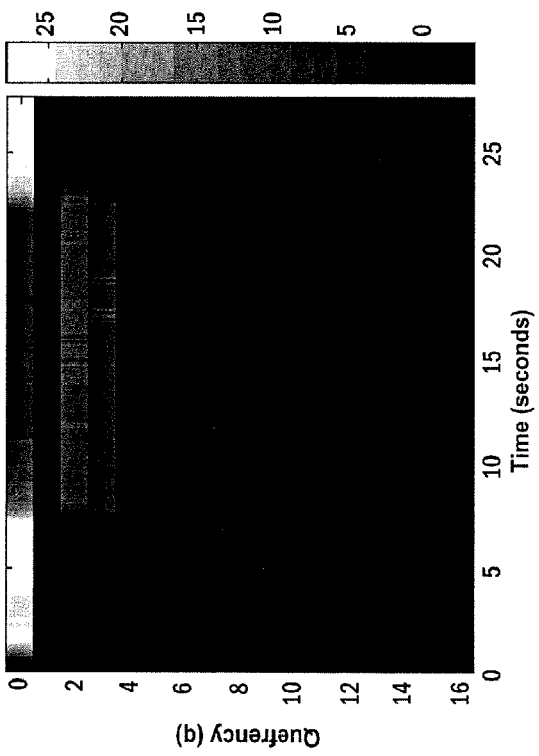

In particular, FIGS. 23a to 23m illustrate the performance of the third and fifth embodiments of the invention under a telephony fitting of ADRO for normal hearing, in response to a speech+alarm input signal. FIG. 23a is a plot of the input gain specification (i.e. desired gains) in dB vs. frequency and time. FIGS. 23b and 23c are plots of the filter magnitude response in dB, of the third embodiment and fifth embodiment, respectively. FIGS. 23d and 23e are plots of the gain error in dB, of the third embodiment and fifth embodiment, respectively. FIGS. 23f and 23g are plots of the group delay in samples, of the third embodiment and fifth embodiment, respectively. FIGS. 23h and 23i are plots of the filter impulse response, of the third embodiment and fifth embodiment, respectively. FIGS. 23j and 23k are plots of the filter phase in radians, of the third embodiment and fifth embodiment, respectively. Note the radians scale of FIG. 23k is much reduced compared to the radians scale of FIG. 23j. FIG. 23l is a plot of the causal half of the cepstrum c[q] (i.e. pre-modification), and FIG. 23m is a plot of the causal half of the cepstrum $\hat{c}_{min}[q]$ (i.e. post-modification).

Figure 24D:
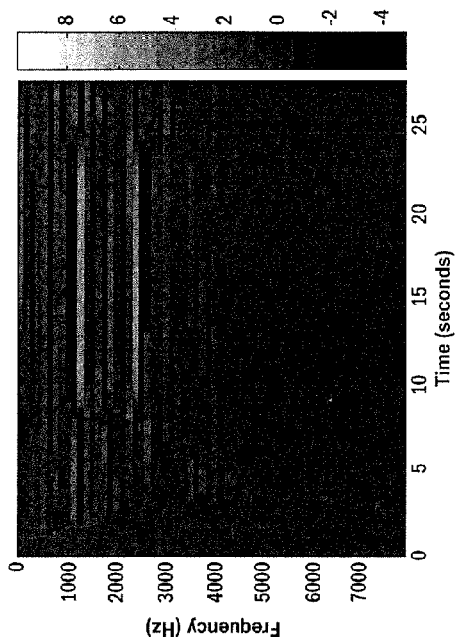
Figure 24E:
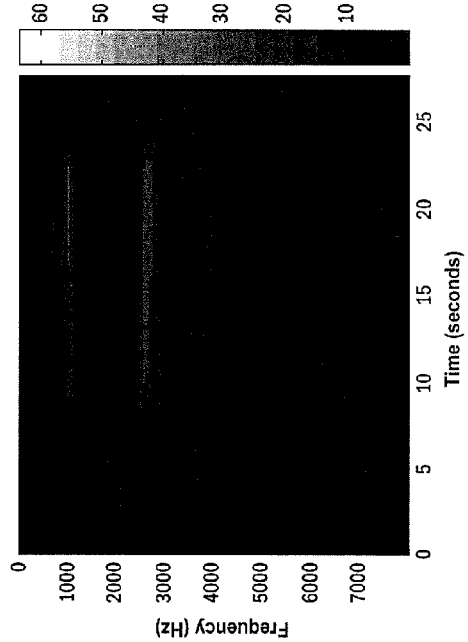
Figure 24F:
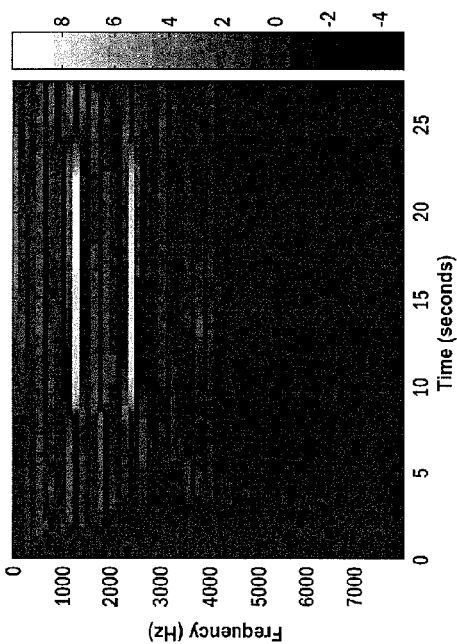
Figure 24G:
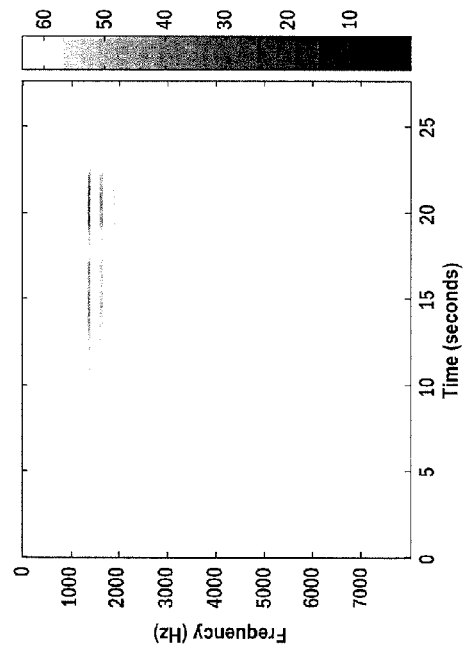
Figure 24I:
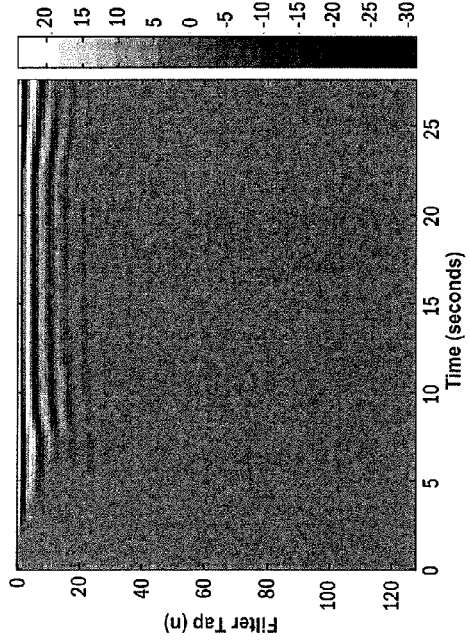
Figure 24K:
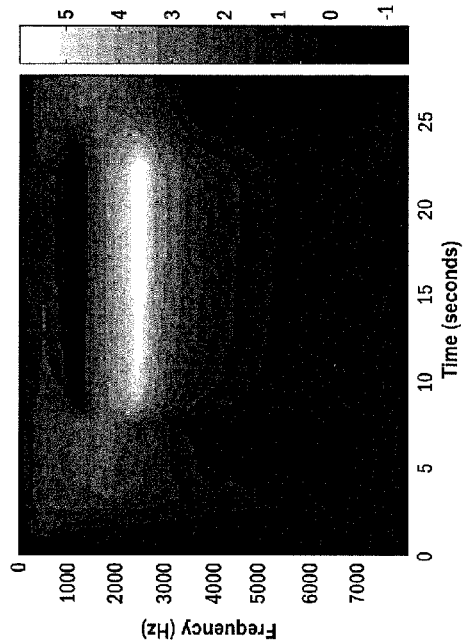
Figure 24H:
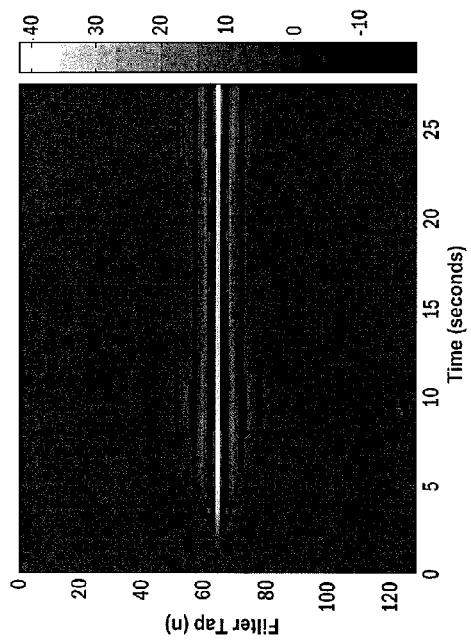
Figure 24J:
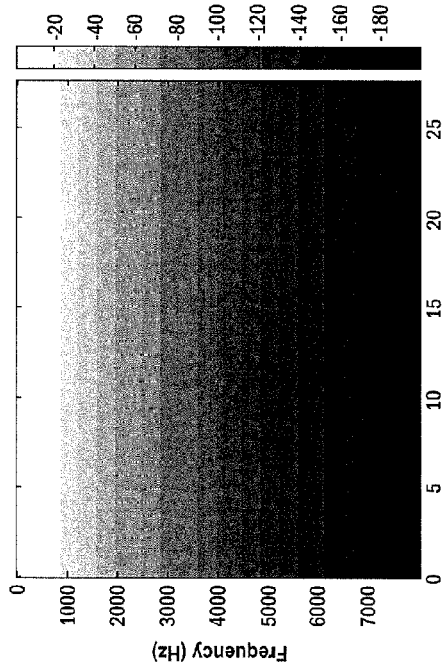
Figure 24M:
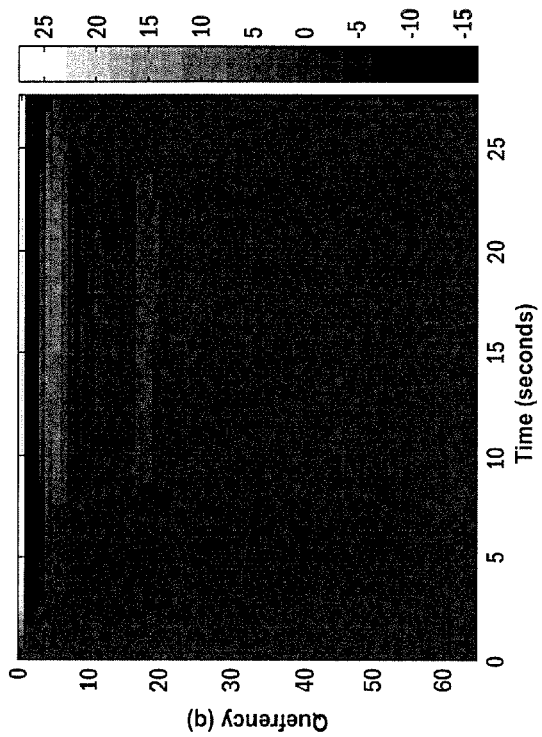
Figure 24L:
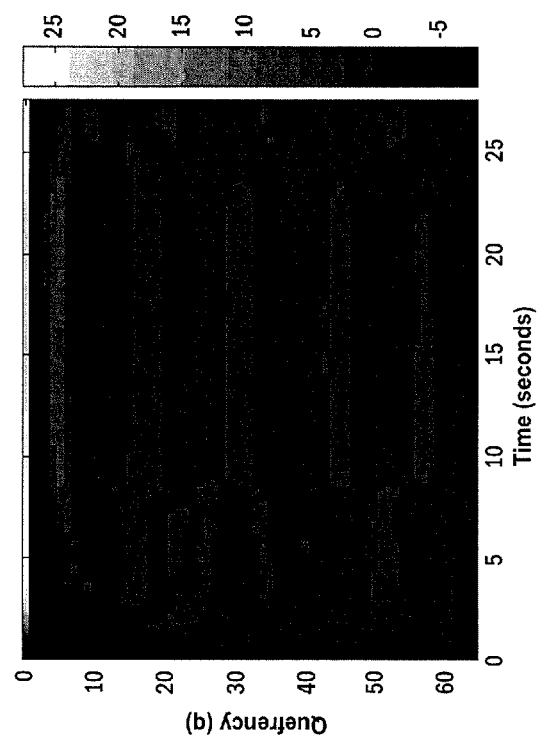

FIGS. 24a to 24m (FIG. 24) illustrate the performance of the third and fifth embodiments of the invention under a hearing aid fitting of ADRO for the audiogram of FIG. 22, in response to a speech +alarm input signal. FIG. 24a is a plot of the input gain specification (i.e. desired gains) in dB vs. frequency and time. FIGS. 24b and 24c are plots of the filter magnitude response in dB, of the third embodiment and fifth embodiment, respectively. FIGS. 24d and 24e are plots of the gain error in dB, of the third embodiment and fifth embodiment, respectively. FIGS. 24f and 24g are plots of the group delay in samples, of the third embodiment and fifth embodiment, respectively. FIGS. 24h and 24i are plots of the filter impulse response, of the third embodiment and fifth embodiment, respectively. FIGS. 24j and 24k are plots of the filter phase in radians, of the third embodiment and fifth embodiment, respectively. Note the radians scale of FIG. 24k is much reduced compared to the radians scale of FIG. 24j. FIG. 24l is a plot of the causal half of the cepstrum c[q] (i.e. pre-modification), and FIG. 24m is a plot of the causal half of the cepstrum $\hat{c}_{min}$[q] (i.e. post-modification).

Figure 25D:
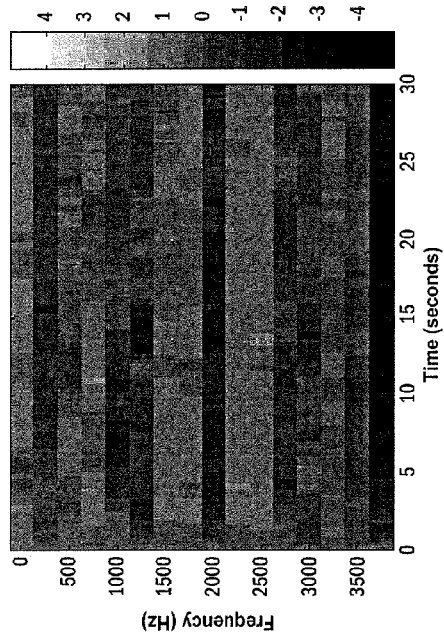
Figure 25E:
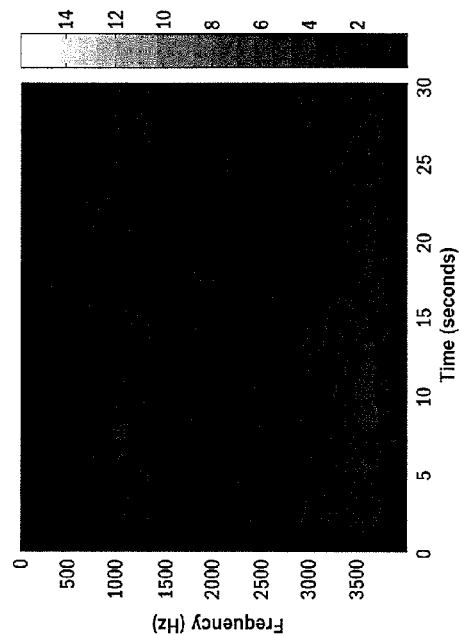
Figure 25F:
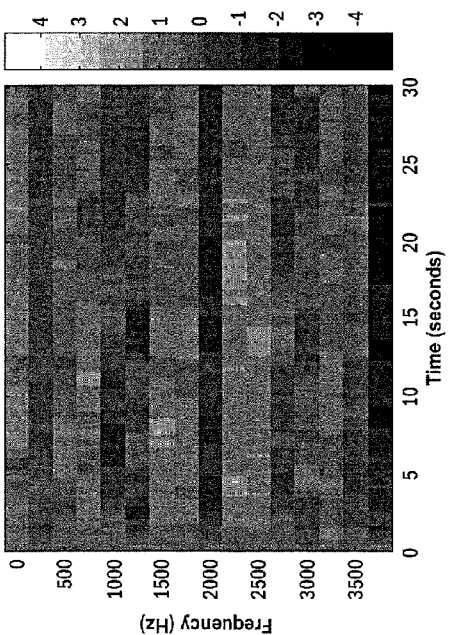
Figure 25G:
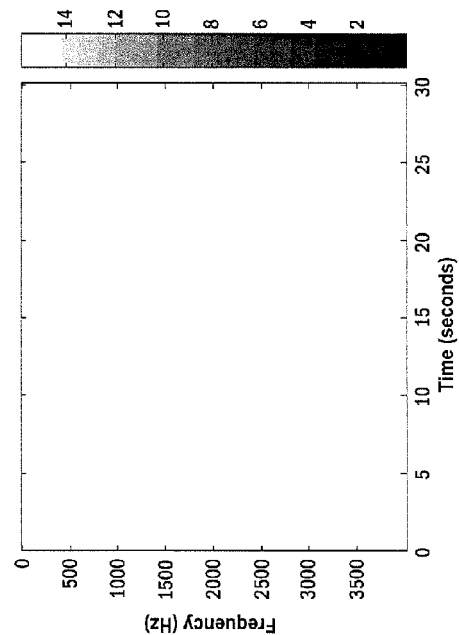
Figure 25H:
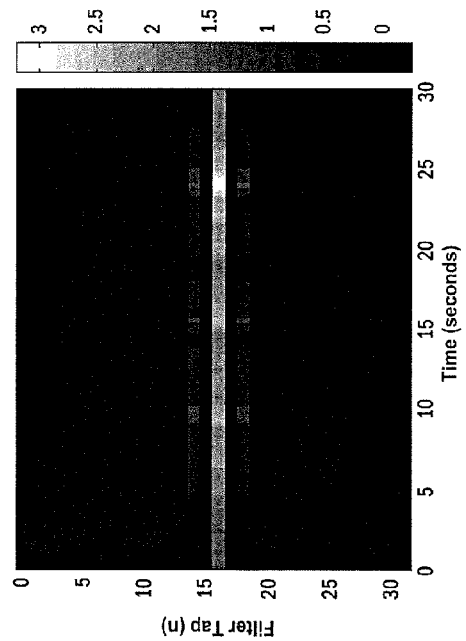
Figure 25I:
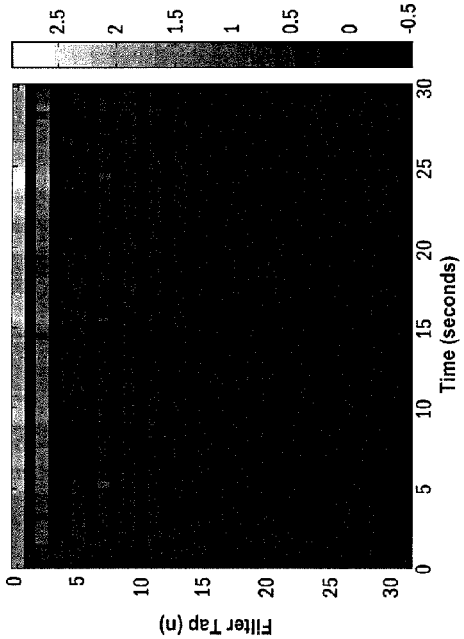
Figure 25J:
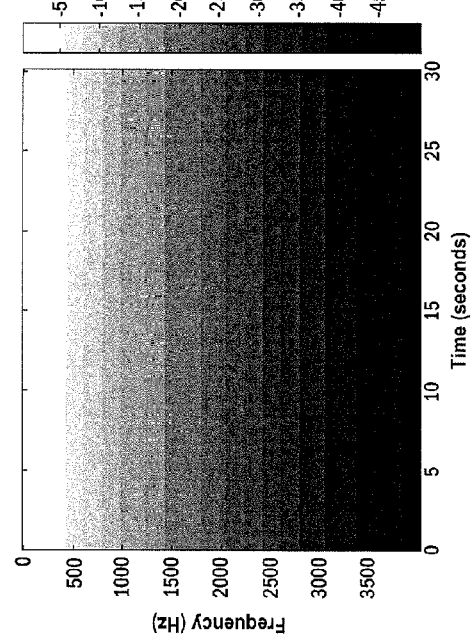
Figure 25K:
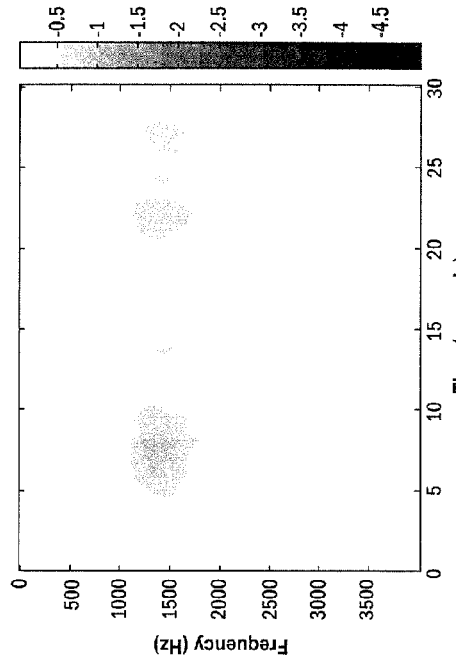
Figure 25M:
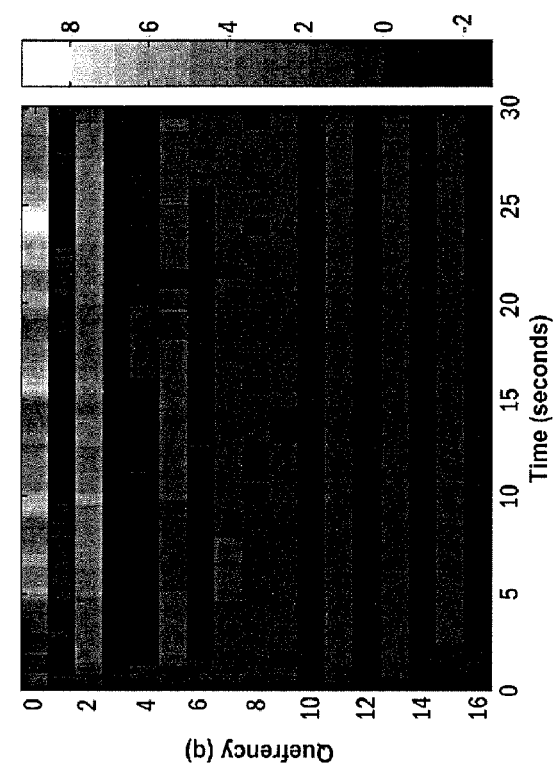
Figure 25L:
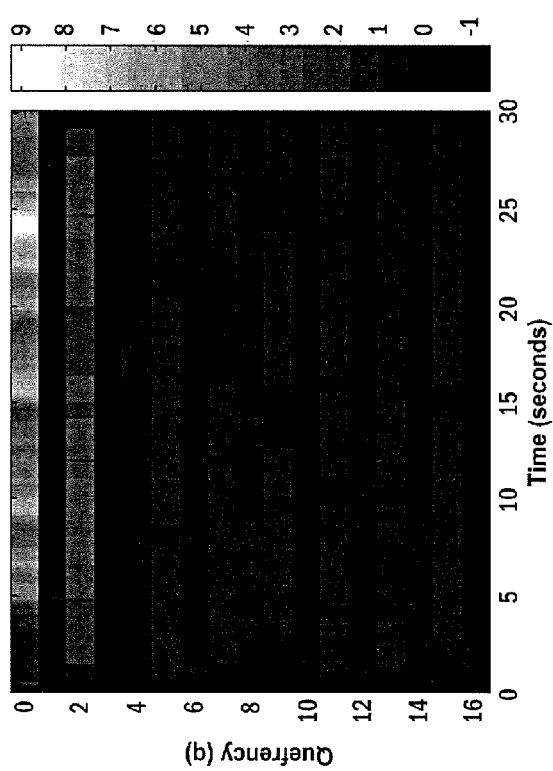

FIGS. 25a to 25m illustrate the performance of the third and fifth embodiments of the invention under a telephony fitting of ADRO for normal hearing, in response to a speech input signal. FIG. 25a is a plot of the input gain specification (i.e. desired gains) in dB vs. frequency and time. FIGS. 25b and 25c are plots of the filter magnitude response in dB, of the third embodiment and fifth embodiment, respectively. FIGS. 25d and 25e are plots of the gain error in dB, of the third embodiment and fifth embodiment, respectively. FIGS. 25f and 25g are plots of the group delay in samples, of the third embodiment and fifth embodiment, respectively. FIGS. 25h and 25i are plots of the filter impulse response, of the third embodiment and fifth embodiment, respectively. FIGS. 25j and 25k are plots of the filter phase in radians, of the third embodiment and fifth embodiment, respectively. Note the radians scale of FIG. 25k is much reduced compared to the radians scale of FIG. 25j. FIG. 25l is a plot of the causal half of the cepstrum c[q] (i.e. pre-modification), and FIG. 25m is a plot of the causal half of the cepstrum $\hat{c}_{min}$[q] (i.e. post-modification).

Figure 26E:
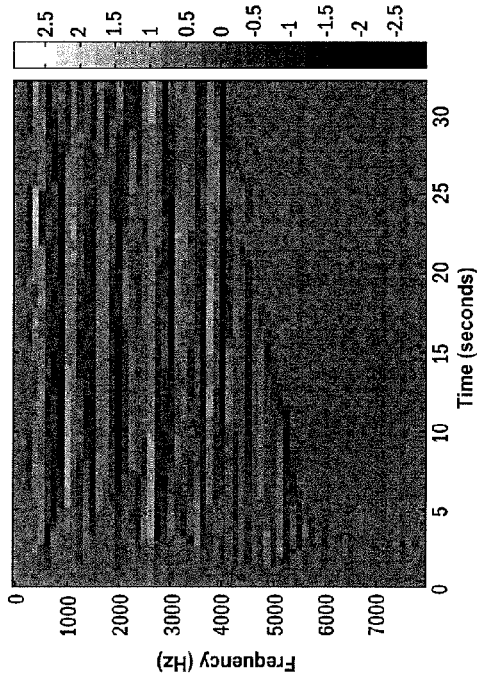
Figure 26G:
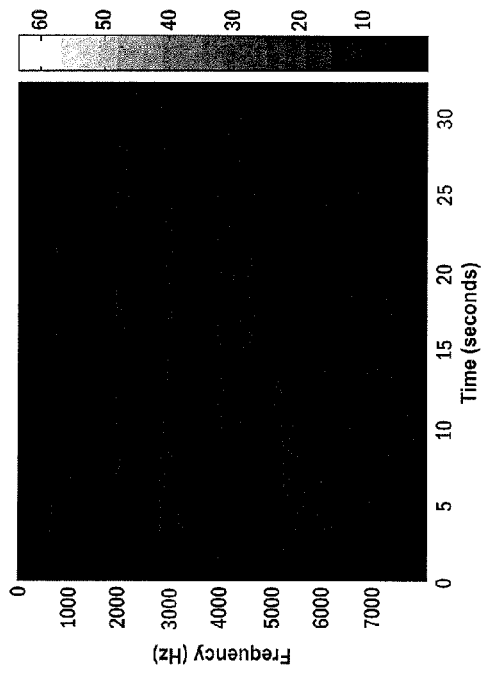
Figure 26D:
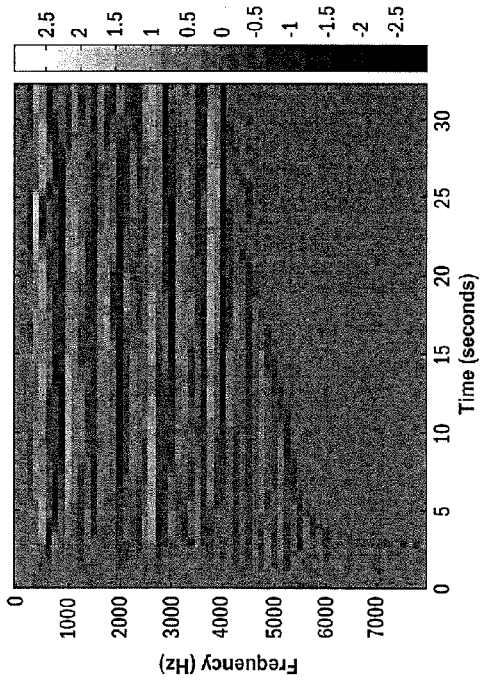
Figure 26F:
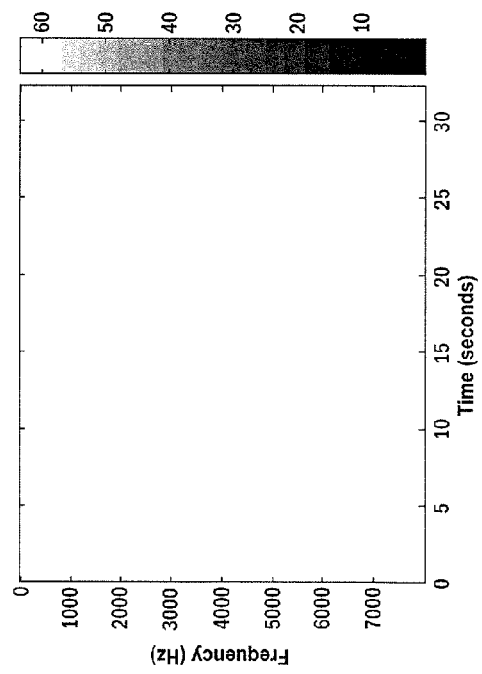
Figure 26I:
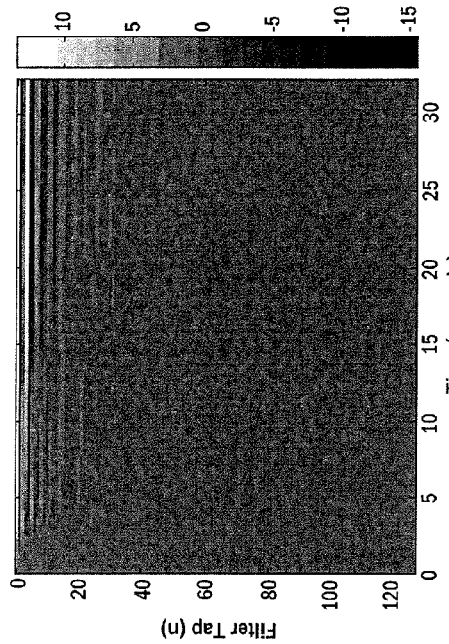
Figure 26K:
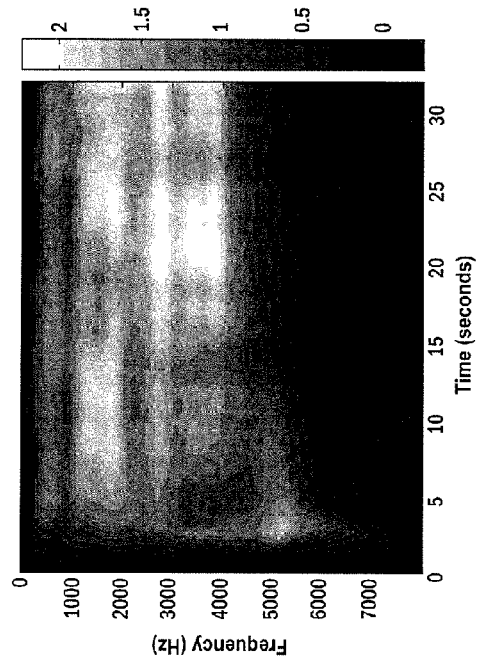
Figure 26H:
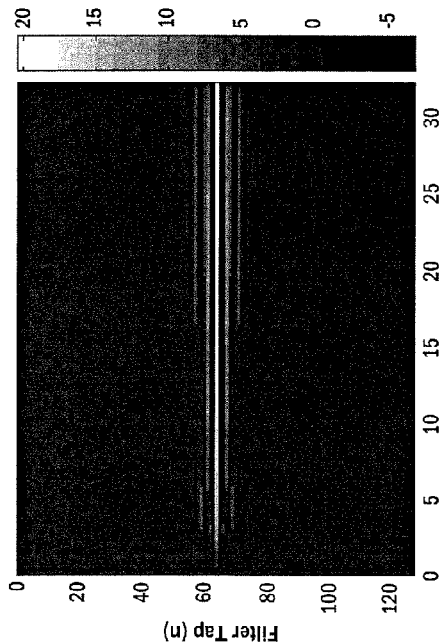
Figure 26J:
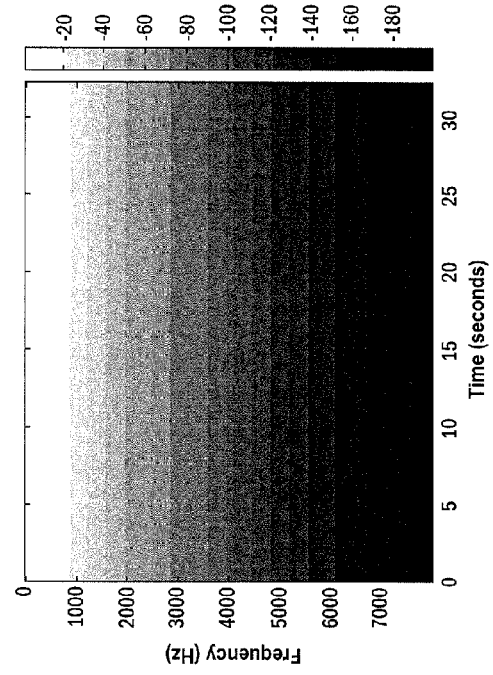
Figure 26M:
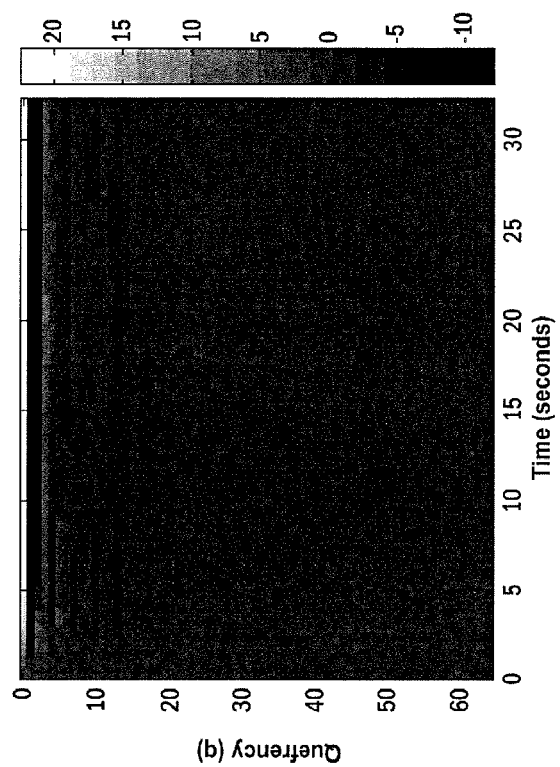
Figure 26L:
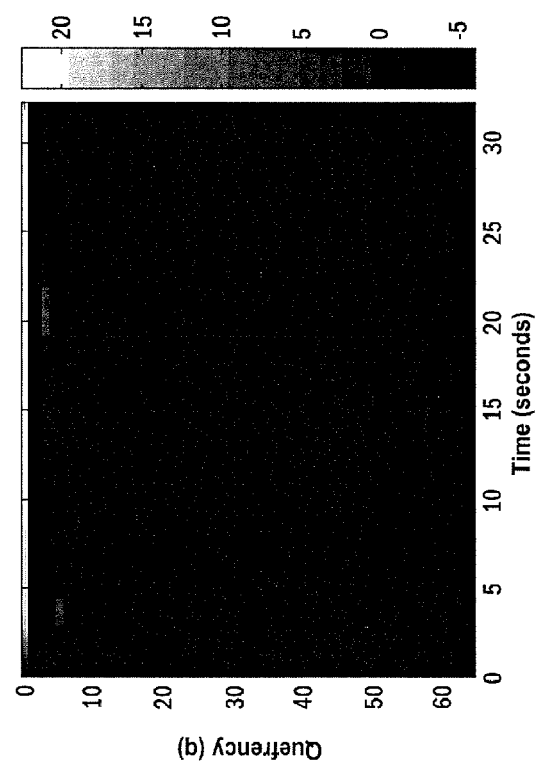

Finally, FIGS. 26a to 26m (FIG. 26) illustrate the performance of the third and fifth embodiments of the invention under a hearing aid fitting of ADRO for the audiogram of FIG. 22, in response to a speech input signal. FIG. 26a is a plot of the input gain specification (i.e. desired gains) in dB vs. frequency and time. FIGS. 26b and 26c are plots of the filter magnitude response in dB, of the third embodiment and fifth embodiment, respectively. FIGS. 26d and 26e are plots of the gain error in dB, of the third embodiment and fifth embodiment, respectively. FIGS. 26f and 26g are plots of the group delay in samples, of the third embodiment and fifth embodiment, respectively. FIGS. 26h and 26i are plots of the filter impulse response, of the third embodiment and fifth embodiment, respectively. FIGS. 26j and 26k are plots of the filter phase in radians, of the third embodiment and fifth embodiment, respectively. Note the radians scale of FIG. 26k is much reduced compared to the radians scale of FIG. 26j. FIG. 26l is a plot of the causal half of the cepstrum c[q] (i.e. pre-modification), and FIG. 26m is a plot of the causal half of the cepstrum $\hat{c}_{min}$[q] (i.e. post-modification).

Informal listening tests confirmed no perceivable imperfections or differences between the processed output signals for the case study tests of the third embodiment and fifth embodiment. The table following however provides a summary of the key quantitative results. Root mean square (rms) gain error, maximum absolute gain error, and mean group delay values were calculated across time and frequency for the processing in each case study. These results appear to confirm the findings from FIG. 16, indicating the fifth embodiment cepstral minimum phase and cepstral smoothing scheme actually reduces filter synthesis error in most cases, while nearly eliminating group delay.

| | | | | | Third embodiment Symmetric, Linear Phase | | | Fifth embodiment Cepstral Minimum Phase | | |
|---|---|---|---|---|---|---|---|---|---|---|
| #. | Input | Fitting | N | $f_s$ (Hz) | rms err. (dB) | max. |err.| (dB) | mean $T_d$ (ms) | rms err. (dB) | max. |err.| (dB) | mean $T_d$ (ms) |
| 1 | Alarm | Telephony | 17 | 8k | 3.03 | 15.35 | 2.00 | 1.77 | 6.31 | 0.17 |
| 2 | Alarm | Hearing Aid | 65 | 16k | 1.11 | 9.63 | 4.00 | 0.68 | 4.33 | 0.11 |
| 3 | Speech | Telephony | 17 | 8k | 0.84 | 2.59 | 2.00 | 0.92 | 3.45 | 0.05 |
| 4 | Speech | Hearing Aid | 65 | 16k | 0.35 | 2.04 | 4.00 | 0.33 | 1.81 | 0.06 |

It will be appreciated by persons skilled in the art that numerous variations and/or modifications may be made to the invention as shown in the specific embodiments without departing from the spirit or scope of the invention as broadly described. For example alternate architectures may be exploited within the scope of the present invention, and some example alternate architectures ale illustrated in FIGS. 18 to 21.

Figure 18:
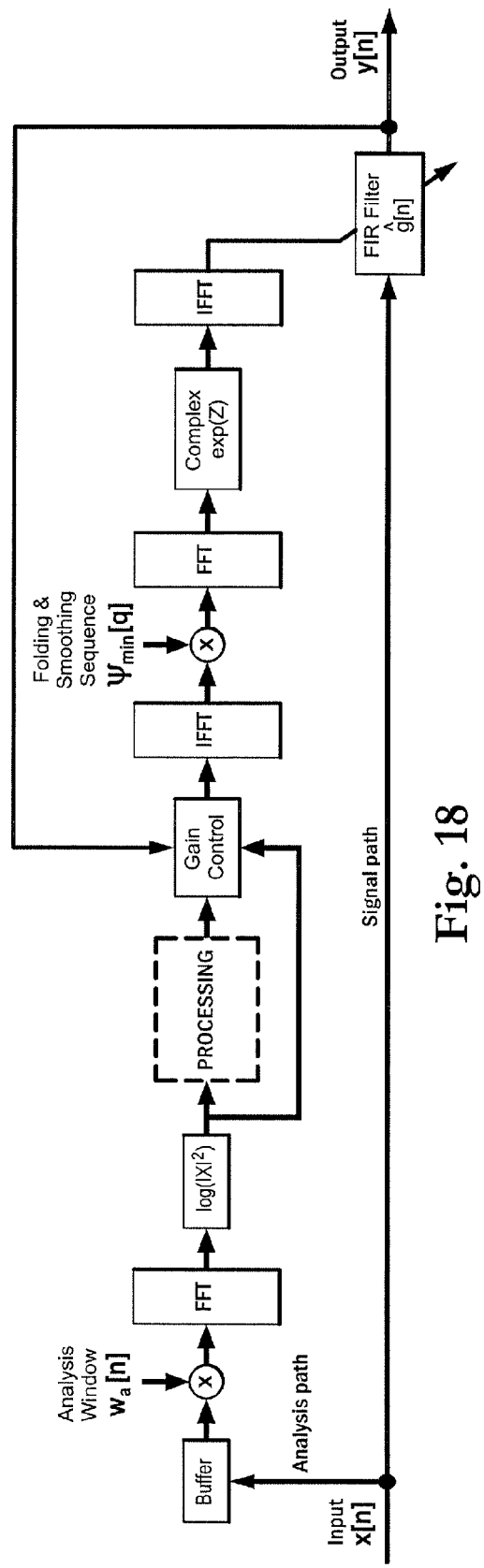
FIG. 18 is a block diagram of a circuit for adaptive filtering signal processing with feed forward offline multi band analysis, and feed back gain control, in accordance with a seventh embodiment of the present invention.
Figure 19:
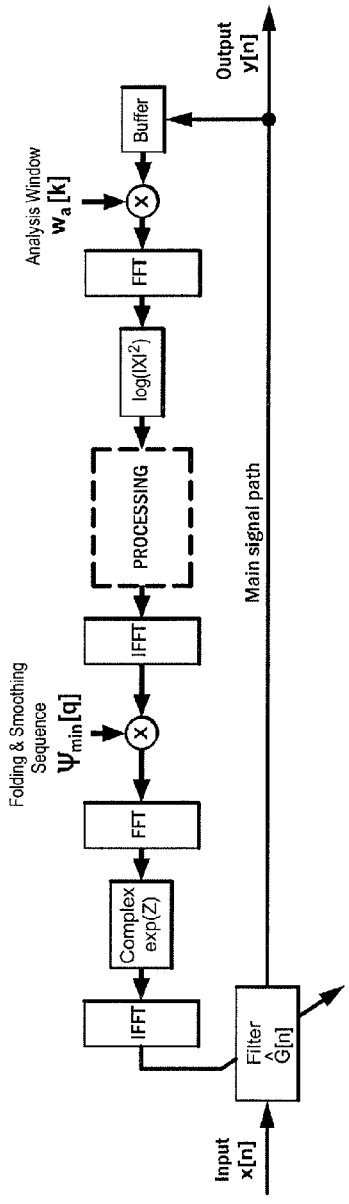
FIG. 19 is a block diagram of a circuit for adaptive filtering signal processing with feed back offline multi band analysis, in accordance with an eighth embodiment of the present invention.

FIG. 18 is a block diagram of a circuit for adaptive filtering signal processing with feed forward offline multi band analysis, and feed back gain control, in accordance with a seventh embodiment of the present invention. FIG. 19 is a block diagram of a circuit for adaptive filtering signal processing with feed back offline multi band analysis, in accordance with an eighth embodiment of the present invention.

Figure 20:
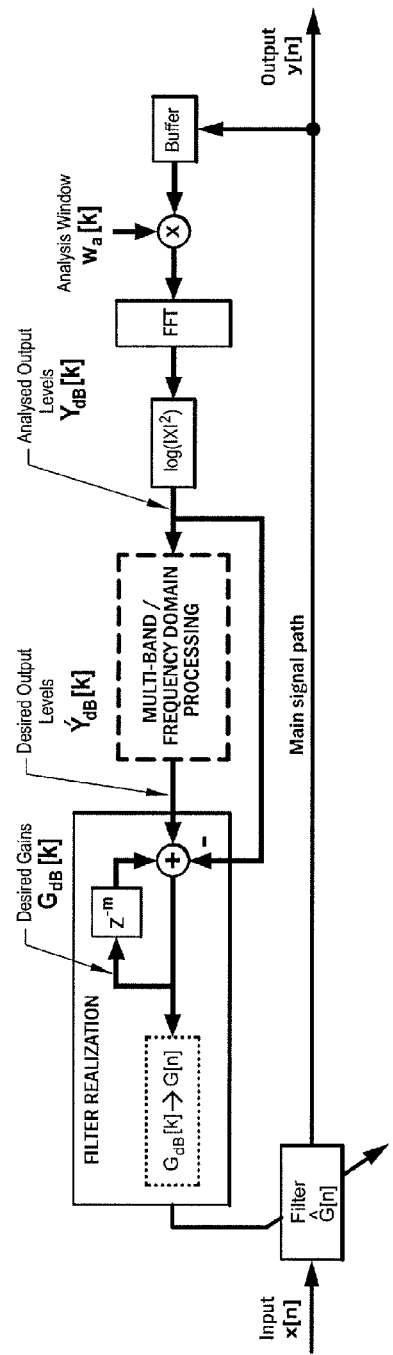
FIG. 20 is a block diagram of a circuit for adaptive filtering signal processing with feed back offline multi band analysis, in accordance with a ninth embodiment of the present invention.

FIG. 20 is a block diagram of a circuit for adaptive filtering signal processing with feed back offline multi band analysis, in accordance with a ninth embodiment of the present invention. The circuit of FIG. 20 is essentially the FIG. 3 arrangement converted to feedback form, with the addition of block $z^{-m}$. As the difference between the desired output levels $\hat{Y}_{dB}$[k] and analysed output levels $Y_{dB}$[k] is the additional required gain required from the filter realisation, the addition of the filter gains from the previous iteration of the filter realisation by way of block $z^{-m}$ yields the full desired gains $G_{dB}$[k] for the subsequent iteration of the filter realisation. In contrast to FIG. 14 in which the output of the multi-band frequency domain processing block is desired gins, the output of the multi-band frequency domain processing block in FIG. 20 is desired output levels. In FIG. 20, the translation from desired output levels to desired gains is included as part of the filter realization block, instead of being part of the multi-band frequency domain processing block as is the case in FIG. 14.

Figure 21:
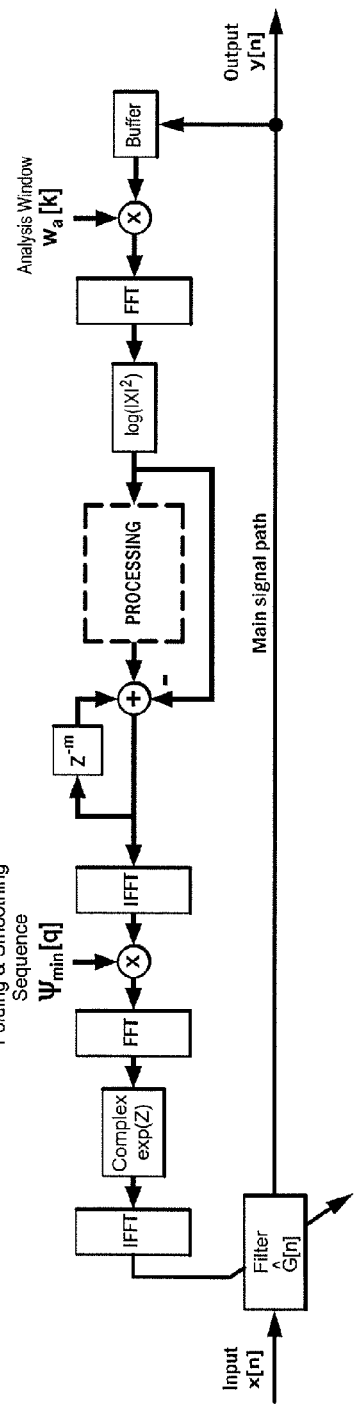
FIG. 21 is a block diagram of a circuit for adaptive filtering signal processing with feed back offline multi band analysis, in accordance with a tenth embodiment of the present invention.

FIG. 21 is a block diagram of a circuit for adaptive filtering signal processing with feed back offline multi band analysis and cepstral minimum phase filter synthesis, in accordance with a tenth embodiment of the present invention. In contrast to FIG. 19 in which the output of the multi-band frequency domain processing block is desired gains, the output of the multi-baud frequency domain processing block in FIG. 21 is desired output levels. Block $z^{-m}$ in FIG. 21 performs a comparable role to block $z^{-m}$ in FIG. 20. The present embodiments are, therefore, to be considered in all respects as illustrative and not restrictive.

The invention claimed is:

1. A method executed by a signal processor for adaptively processing an input signal, the method comprising:
  electronically passing the input signal through an adaptive time domain filter to produce an output signal;
  taking at least one of the input signal and the output signal as an analysis signal;
  electronically transforming the analysis signal into a frequency domain to produce a transformed analysis signal;
  analysing the transformed analysis signal to produce a plurality of desired gains each corresponding to a respective frequency domain sub-band;
  synthesising a minimum phase time domain filter characteristic which approaches the desired gains by:
    obtaining the cepstrum (IFFT) of the logarithmically expressed desired gains;
    ensuring the cepstrum is causal; and
    taking the FFT of the causal cepstrum to produce logarithmically expressed minimum phase desired gains; and
  electronically updating the adaptive filter with the synthesised filter characteristic.

2. The method of claim 1 wherein ensuring the cepstrum is causal comprises electronically applying a folding sequence $\lambda_{min}[q]$ to the cepstrum, to fold exponentials of the cepstrum quefrency components in the non-causal rear half of the cepstrum into the causal forward half of the cepstrum.

3. The method of claim 2 wherein the folding sequence is also a cepstral smoothing sequence.

4. The method of claim 2 wherein a synthesis window function is applied in the time domain as part of filter synthesis for spectral smoothing.

5. The method of claim 4 wherein the synthesis window function comprises one of a rectangular window, a Hamming window, and a hybrid asymmetric Hamming function.

6. The method of claim 2 further comprising:
  converting the causal cepstrum back to a complex numbered spectrum (logarithmically expressed minimum phase desired gains) by FFT;
  converting the logarithmically expressed minimum phase desired gains to linear expression by taking the exponential; and
  returning the linearly expressed minimum phase desired gains to the time domain by IFFT to form the basis of time domain filter synthesis.

7. The method of claim 2 wherein the folding sequence $\lambda_{min}[q]$ for ensuring the cepstrum is causal comprises:

$0 < \lambda_{min}[q] < 2$ for $q=0 \ldots L/2+1$ $\lambda_{min}[q]=0$ for $q=L/2+2 \ldots L-1$, where L is the window/FFT length, and $q=0 \ldots L-1$.

8. The method of claim 2 wherein the folding sequence $\lambda_{min}[q]$ comprises:

$\lambda_{min}[q]=0.54+0.46\cos(2\pi q/L)$ for $q=0$ & $L/2+1$ $\lambda_{min}[q]=1.08+0.92\cos(2\pi q/L)$ for $q=1 \ldots L/2$ $\lambda_{min}[q]=0$ otherwise.

9. The method of claim 2 wherein the folding sequence $\lambda_{min}[q]$ comprises:

$\lambda_{min}[q]=1$ for $q=0$ & $L/2+1$ $\lambda_{min}[q]=2$ for $q=L, L/2$ $\lambda_{min}[q]=0$ otherwise.

10. The method of claim 1 wherein the adaptive filter is a FIR filter, and wherein synthesis of the minimum phase filter characteristic comprises:
  expressing a characteristic polynomial of the FIR filter;
  factoring the characteristic polynomial to locate poles and zeros of the FIR filter; and
  revising the characteristic polynomial by reciprocating each pole and zero outside the unit circle into the unit circle, to obtain a minimum phase FIR filter.

11. The method of claim 1 wherein the adaptive time domain filter is selected from a single FIR filter, a mix of filters, whether FIR or IIR, a non-linear filter and a neural network.

12. The method of claim 1 wherein updating the adaptive filter to at least approach the synthesized filter characteristic comprises varying the adaptive filter by no more than a predefined amount, in order to avoid inappropriate user perceptions.

13. A computer readable medium comprising a data storage storing a computer program for adaptively processing an input signal, the computer program comprising:
  computer program code for causing a processor to pass the input signal through an adaptive time domain filter to produce an output signal;
  computer program code for causing a processor to take at least one of the input signal and the output signal as an analysis signal;
  computer program code for causing a processor to transform the analysis signal into a frequency domain to produce a transformed analysis signal;
  computer program code for causing a processor to analyze the transformed analysis signal to produce a plurality of desired gains each corresponding to a respective frequency domain sub-band;
  computer program code for causing a processor to synthesize a minimum phase time domain filter characteristic which approaches the desired gains, by:
    obtaining the cepstrum IFFT of the logarithmically expressed desired gains;
    ensuring the cepstrum is causal; and
    taking the FFT of the causal cepstrum to produce logarithmically expressed minimum phase desired gains; and
  computer program code for causing a processor to update the adaptive filter with the synthesised filter characteristic.

14. The computer readable medium of claim 13 wherein the computer program code for ensuring the cepstrum is causal comprises computer program code for applying a folding sequence to the cepstrum, to fold exponentials of the cepstrum quefrency components in the non-causal rear half of the cepstrum into the causal forward half of the cepstrum.

15. The computer readable medium of claim 14 wherein the folding sequence is also a cepstral smoothing sequence.

16. The computer readable medium of claim 14 further comprising computer program code for applying a synthesis window function in the time domain as part of filter synthesis for spectral smoothing.

17. The computer readable medium of claim 14 further comprising:
  computer program code for causing a processor to convert the causal cepstrum back to a complex numbered spectrum by FFT;
  computer program code for causing a processor to convert the logarithmically expressed minimum phase desired gains to linear expression by taking the exponential; and
  computer program code for causing a processor to return the linearly expressed minimum phase desired gains to the time domain by IFFT to form the basis of time domain filter synthesis.

18. A device for adaptively processing an input signal, the device comprising:
- an adaptive time domain filter for producing an output signal from an input signal;
- an FFT block for taking an analysis signal from at least one of the input signal and the output signal, and for transforming the analysis signal into a frequency domain to produce a transformed analysis signal;
- a processor for analysing the transformed analysis signal to produce a plurality of desired gains each corresponding to a respective transform domain sub-band;
- a filter synthesiser for synthesising a minimum phase time domain filter characteristic which approaches the desired gains, the filter synthesiser comprising:
  - an IFFT block for obtaining the cepstrum IFFT of the logarithmically expressed desired gains;
  - means for ensuring the cepstrum is causal; and
  - an FFT block for taking the FFT of the causal cepstrum to produce logarithmically expressed minimum phase desired gains;
- wherein the adaptive filter is capable of being updated with the synthesised filter characteristic.

19. The device of claim 18 wherein the means for ensuring the cepstrum is causal comprises a folding stage for applying a folding sequence to the cepstrum, to fold exponentials of the cepstrum quefrency components in the non-causal rear half of the cepstrum into the causal forward half of the cepstrum.

20. The device of claim 19 wherein the folding sequence is also a cepstral smoothing sequence.

21. The device of claim 19 wherein the filter synthesiser comprises a time domain synthesis window function applicator for spectral smoothing.

* * * * *